United States Patent [19]
Gomi

[11] Patent Number: 5,389,561
[45] Date of Patent: Feb. 14, 1995

[54] METHOD FOR MAKING SOI TYPE BIPOLAR TRANSISTOR

[75] Inventor: Takayuki Gomi, Tokyo, Japan

[73] Assignee: Sony Corporation, Tokyo, Japan

[21] Appl. No.: 161,498

[22] Filed: Dec. 2, 1993

Related U.S. Application Data

[62] Division of Ser. No. 989,514, Dec. 11, 1992, abandoned.

[30] Foreign Application Priority Data

Dec. 13, 1991 [JP]  Japan ................................. 3-330561
Dec. 13, 1991 [JP]  Japan ................................. 3-330562

[51] Int. Cl.$^6$ ......................................... H01L 21/265
[52] U.S. Cl. ..................... 437/31; 437/162; 437/62; 437/90
[58] Field of Search ............... 257/557; 437/31, 62, 437/162, 150, 154, 89, 90; 148/DIG. 150

[56] References Cited

U.S. PATENT DOCUMENTS

| 4,780,427 | 10/1988 | Sakai et al. ........................ 257/557 |
| 4,792,837 | 12/1988 | Zazzu ................................. 257/557 |
| 4,990,991 | 2/1991  | Ikeda et al. ....................... 257/557 |
| 5,091,330 | 2/1992  | Cambou et al. ..................... 437/62 |

FOREIGN PATENT DOCUMENTS

| 0241167 | 9/1989  | Japan ................................. 257/557 |
| 0246871 | 10/1989 | Japan ................................. 437/31 |

OTHER PUBLICATIONS

Higaki et al., "A Thin-Base Lateral Bipolar Transistor Fabricated on Bonded SOI", Autumn Meeting Held by Institute of Society of Electronics, Information and Communication Engineers, 1991, pp. SC-9-8, 5-216, 5-217.

Primary Examiner—Brian E. Hearn
Assistant Examiner—Tuan Nguyen
Attorney, Agent, or Firm—Hill, Steadman & Simpson

[57] ABSTRACT

The present invention is directed to a SOI type bipolar transistor and a method of making the transistor. The transistor comprises an element forming region, which is surrounded on its side portions and a lower surface portion by an insulating layer, an emitter region, a base region, a collector region, each of the emitter, base and collector regions being disposed within the element forming region, and a semiconductor layer formed on the element forming region at a portion corresponding to an opening portion of an interlayer and which becomes an emitter diffusion layer, so that a part of the semiconductor layer is grown under the condition that the semiconductor layer is overgrown over the interlayer in the lateral direction, a junction surface between the base region and the collector region exists under the overgrown portion of the semiconductor layer and the emitter region is surrounded on its side portions and its lower portion by the base region.

9 Claims, 23 Drawing Sheets

FIG. 3 (PRIOR ART)
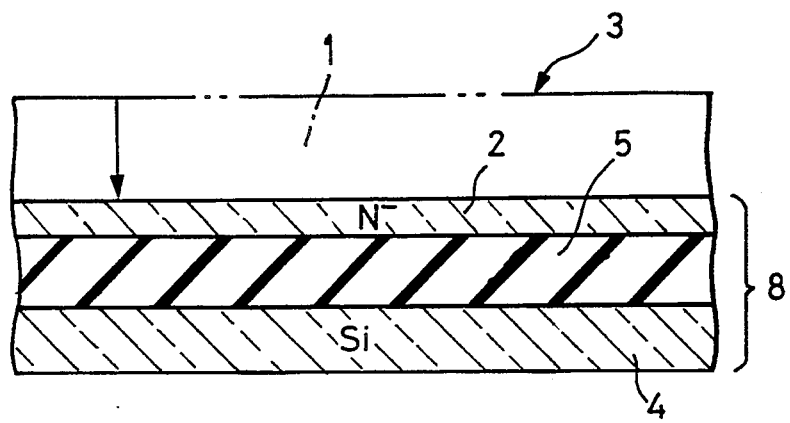
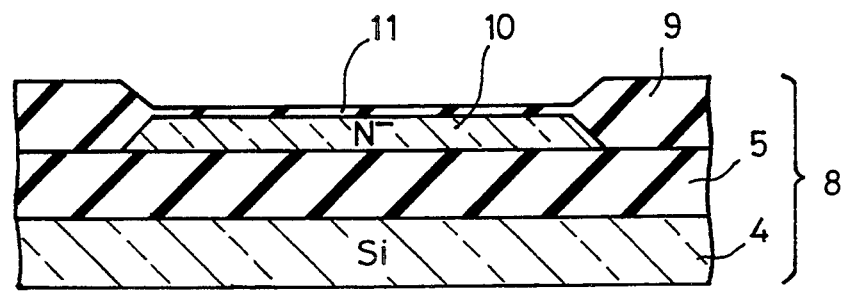
FIG. 4A
(PRIOR ART)
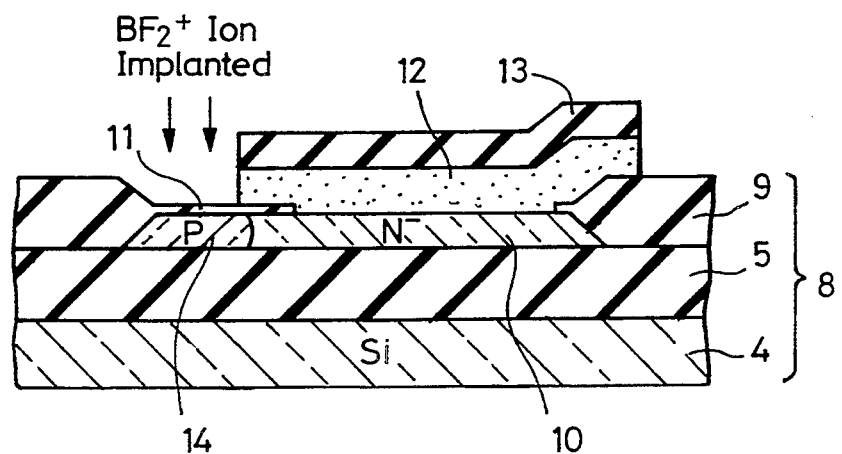
FIG. 4B
(PRIOR ART)

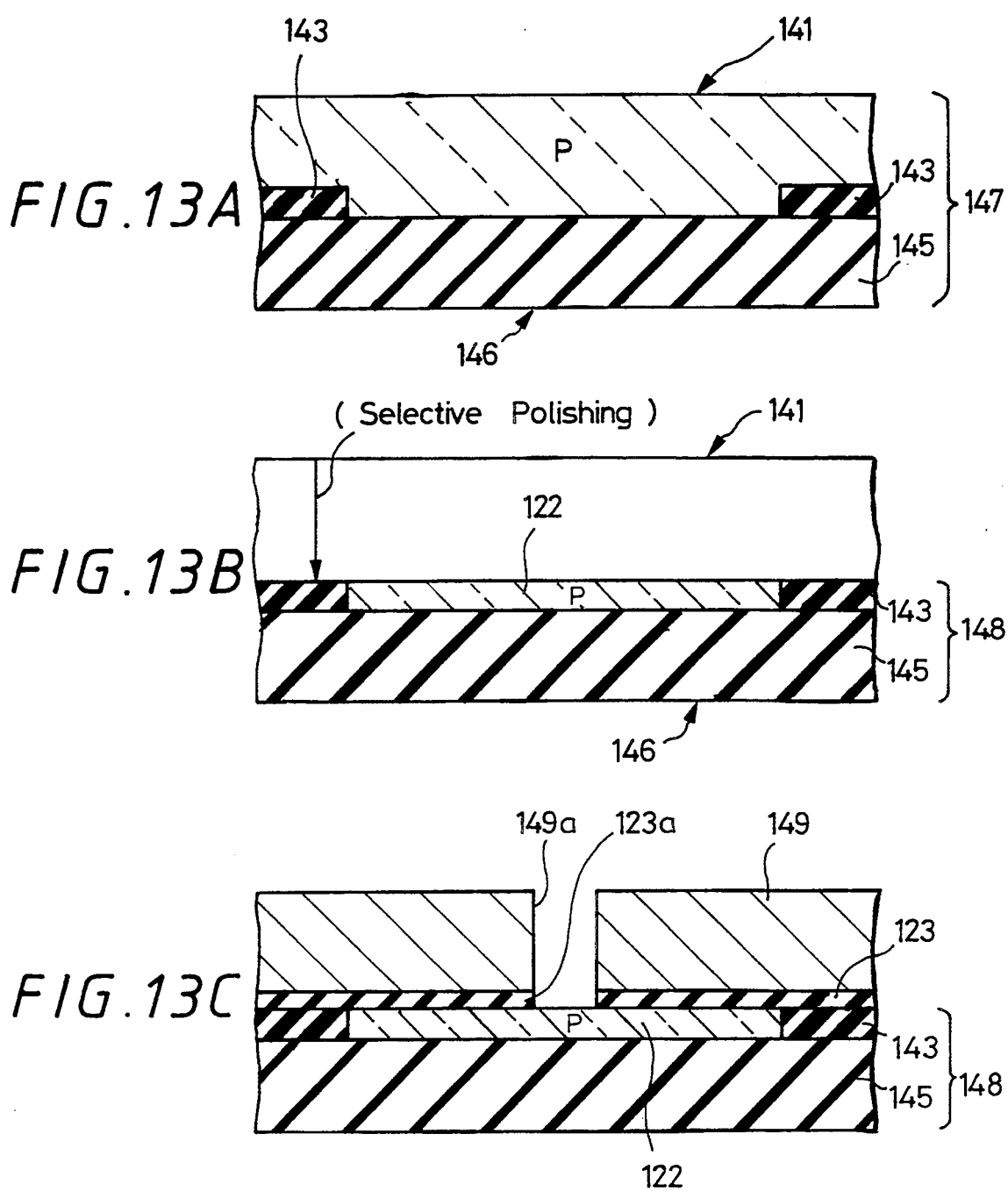

METHOD FOR MAKING SOI TYPE BIPOLAR TRANSISTOR

This is a division of application Ser. No. 07/989,514, filed Dec. 11, 1992, now abandoned.

BACKGROUND OF THE INVENTION

1. Field of the Invention

The present invention relates to a lateral type transistor in which an emitter region, a base region and a collector region are formed in the lateral direction within the element forming region of an SOI (silicon on insulator) substrate formed by some suitable process such as a bonding process or the like and a manufacturing method thereof.

2. Description of the Prior Art

As a future VLSI (very large-scale integrated circuit), a bipolar transistor having an SOI structure has received considerable attention because the SOI structure can prevent a latch-up and reduce a parasitic capacitance by a complete separation of an insulating material.

In particular, a lateral type bipolar transistor having an SOI structure can reduce the parasitic capacitance substantially so that it can be realized as an ideal device as much as possible. At present, a BiCMOS LSI has received considerable attention because of its high packing density, lower power dissipation and high speed equivalent to that of a bipolar transistor. If, however, the vertical bipolar transistor and a CMOS transistor are combined, then a resultant transistor becomes complicated in structure, which leads to the increased cost due to the increase of process steps, a decrease of yield or the like.

In this case, considering a CMOS transistor having an SOI structure and a lateral type bipolar transistor having an SOI structure, most of the manufacturing processes of the CMOS transistor and the lateral type bipolar transistor can be made common, thereby making it possible to manufacture a high performance BiCMOS transistor by a very simple manufacturing method. Because of these advantages mentioned above, it is expected that the lateral bipolar transistor having an SOI structure will receive considerable attention from now on.

When a conventional lateral type bipolar transistor having an SOI structure is manufactured, a substrate having an SOI structure (hereinafter simply referred to as an SOI substrate) is produced first. The SOI substrate is manufactured as follows.

Initially, there are prepared a substrate 3 in which an N-type epitaxial layer 2 is grown on a P-type silicon substrate 1 as shown in FIG. 1A of the accompanying drawings and another substrate 6 in which a thermal oxide layer 5 is formed on the surface of a silicon substrate 4 as shown in FIG. 1B of the accompanying drawings. These two substrates 3 and 6 are bonded together while the surface of the epitaxial layer 2 and the surface of the thermal oxide layer 5 are being opposed to each other, thereby manufacturing a bonded substrate 7 shown in FIG. 2 of the accompanying drawings.

Then, as shown in FIG. 3 of the accompanying drawings, the end face of the substrate 3 is ground and polished. Finally, the substrate 3 is treated by a selective etching process composed of the etching action and the mechanical polishing process to thereby remove a silicon substrate 1. Thus, an SOI substrate 8 in which the silicon layer 2 is formed on the insulating layer 5 is obtained.

When the lateral bipolar transistor is fabricated on the SOI substrate 8, as shown in FIG. 4A of the accompanying drawings, a field insulating layer 9 is selectively formed by utilizing a selective oxidation method (LOCOS (local oxidation of silicon)). At that time, a silicon layer surrounded by the field insulating layer 9 becomes an element forming region 10.

As shown in FIG. 4B of the accompanying drawings, after a thin thermal oxide layer 11 formed on the element forming region 10 was partly removed by the etching process, an offset region is provided on the element forming region 10 and an N-impurity-doped polycrystalline silicon layer is formed. An $SiO_2$ layer 13 of the same pattern is formed on the polycrystalline silicon layer 12. Thereafter, by the ion implantation technique of P-type impurity, e.g., Boron ($BF_2^+$), a P-type base region 14 is formed within the element forming region 10 at its portion in which the polycrystalline silicon layer 12 is not formed.

As shown in FIG. 5 of the accompanying drawings, a side wall formed of SiN layer, for example, is formed on the side wall of a bilayer film formed of the polycrystalline silicon layer 12 and an $SiO_2$ layer 13. Thereafter, by the ion implantation technique of N-type impurity, e.g., Arsenic ($As^+$), an N-type emitter region 16 is formed within the element forming region 10 m thereby obtaining an SOI lateral bipolar transistor (see "A Thin-Base Lateral Bipolar Transistor Fabricated on Bonded SOI" SC-9-8, pp. 216 to 217, autumn meeting feld by Institute of Society of Electronics, Information and Communication Engineers, 1991). In this case, the base is derived by means of a base deriving electrode region 17 continuously overgrown in the lateral direction as shown in a plan view of FIG. 6 of the accompanying drawings. The polycrystalline silicon layer 12 serves as a collector deriving electrode.

The above conventional SOI lateral bipolar transistor employs the bonded SOI substrate 8 so that a crystallizing property of the SOI substrate 8 itself is satisfactory. In addition, since the emitter region 16 and the base region 14 are formed by utilizing an LDD (lightly doped drain) structure of the MOS transistor, a base width Wb can be reduced and a cut-off frequency of $f_{TMAX}=4.5$ GHz can be obtained.

In the conventional lateral type bipolar transistor, the base width Wb is determined by the width of the side wall 15 formed of the SiN layer. The width of the side wall 15 is determined by the thicknesses of the polycrystalline silicon layer 12 and the $SiO_2$ layer 13 and the etching condition of the RIE process.

The polycrystalline silicon layer 12 and $SiO^2$ layer 13 are generally formed by the CVD (chemical vapor deposition) method. When the layer is formed by the CVD method, a fluctuation of about 10% occurs in the thickness direction. Further, since a fluctuation of about 10% is caused by the etching process based on the RIE process, the width of the formed side wall 15 is also fluctuated considerably. As a result, control of the side wall width, i.e., base width Wb becomes unstable and a reduction of the base width Wb is unavoidably limited.

Furthermore, according to the conventional SOI lateral bipolar transistor, the base electrode is derived only from the longitudinal direction of the base region 14 so that a series resistance Rb of the base is increased, thereby decreasing the operation speed in a large current area.

OBJECTS AND SUMMARY OF THE INVENTION

Therefore, it is an object of the present invention to provide an improved method and apparatus for SOI bipolar transistor in which the aforesaid shortcomings and disadvantages of the prior art can be eliminated.

More specifically, it is an object of the present invention to provide a method and apparatus for SOI bipolar transistor in which a base width of the SOI bipolar transistor can be reduced.

Another object of the present invention is to provide a method and apparatus for SOI bipolar transistor in which a base resistance of the SOI bipolar transistor can be reduced.

According to a first aspect of the present invention, there is provided a semiconductor apparatus which comprises an element forming region surrounded from its side portion to a lower portion by an insulating layer, an emitter region, a base region, a collector region, each of the emitter, base and collector regions being disposed within the element forming region, and a semiconductor layer formed on the element forming region at its portion corresponding to an opening portion of an interlayer and which becomes an emitter diffusion layer, wherein a part of the semiconductor layer being grown under the condition that the semiconductor layer is overgrown over the interlayer in the lateral direction, a bonded surface between the base region and the collector region exists under the overgrown portion of the semiconductor layer and the emitter region is surrounded from its side portion to its lower portion by the base region.

According to a second aspect of the present invention, there is provided a method for manufacturing a semiconductor apparatus in which second conductivity type emitter region and collector region and a first conductivity type base region are respectively formed in the lateral direction within a first conductivity type element forming region surrounded from its side portion to is lower portion by an insulating layer. This method comprises the steps of forming an interlayer on the element forming region, forming an opening portion on the interlayer at its portion corresponding to a portion which becomes the emitter region, selectively forming a semiconductor layer on the opening portion so that a part of the semiconductor layer is overgrown over the interlayer in the lateral direction, and introducing a second conductivity type impurity which becomes a collector and an emitter diffusion source into one side of the element forming region and the semiconductor layer.

According to a third aspect of the present invention, there is provided a semiconductor apparatus which comprises an element forming region surrounded from its side portion to a lower portion by an insulating layer, an emitter region, a base region, a collector region, each of the emitter, base and collector regions being disposed within the element forming region, an island-shaped insulating layer formed on the element forming region, and a semiconductor layer formed so as to include a part of an upper surface of the insulating layer and which becomes an emitter diffusion layer, wherein a bonded surface between the base region and the collector region exists under the insulating layer and the emitter region is surrounded from its side portion to its lower portion by the base region.

As a fourth aspect of the present invention, there is provided a method for manufacturing a semiconductor apparatus in which first conductivity type emitter region and collector region and a second conductivity type base region are respectively formed in the lateral direction within a first conductivity type element forming region surrounded from its side portion to its lower portion by an insulating layer. This method comprises the steps of forming an island-shaped insulating layer on the element forming region, selectively introducing an impurity for forming a second conductivity type base region into one side of the element forming region under the state that the insulating layer is employed as a mask, and forming a semiconductor layer serving as an emitter diffusion layer on a part of the element forming region in which the impurity is introduced so that the semiconductor layer includes a part of an upper surface of the insulating layer.

As a fifth aspect of the present invention, there is provided a method for manufacturing a semiconductor apparatus in which first conductivity type emitter region and collector region and a second conductivity type base region are respectively formed in the lateral direction within a first conductivity type element forming region surrounded from its side portion to its lower portion by an insulating layer. This method comprises the steps of forming an island-shaped insulating layer on the element forming region, forming a semiconductor layer on a part of one side of the element forming region so that the semiconductor layer includes a part of an upper surface of the insulating layer, introducing an impurity for forming a second conductivity type base region into the exposed semiconductor layer under the state that the other side of the element forming region is masked, and introducing an impurity for forming a first conductivity type emitter region into the exposed semiconductor layer under the state that the other side of the element forming region is masked.

The above and other objects, features, and advantages of the present invention will become apparent from the following detailed description of illustrative embodiments thereof to be read in conjunction with the accompanying drawings, in which like reference numerals are used to identify the same or similar parts in the several views.

BRIEF DESCRIPTION OF THE DRAWINGS

FIG. 3 is a diagrammatic view of a section showing a conventional SOI substrate;

FIGS. 4A and 4B are respectively process diagrams showing a manufacturing method that can realize the transistor according to the example of the prior art;

Figure 8A:
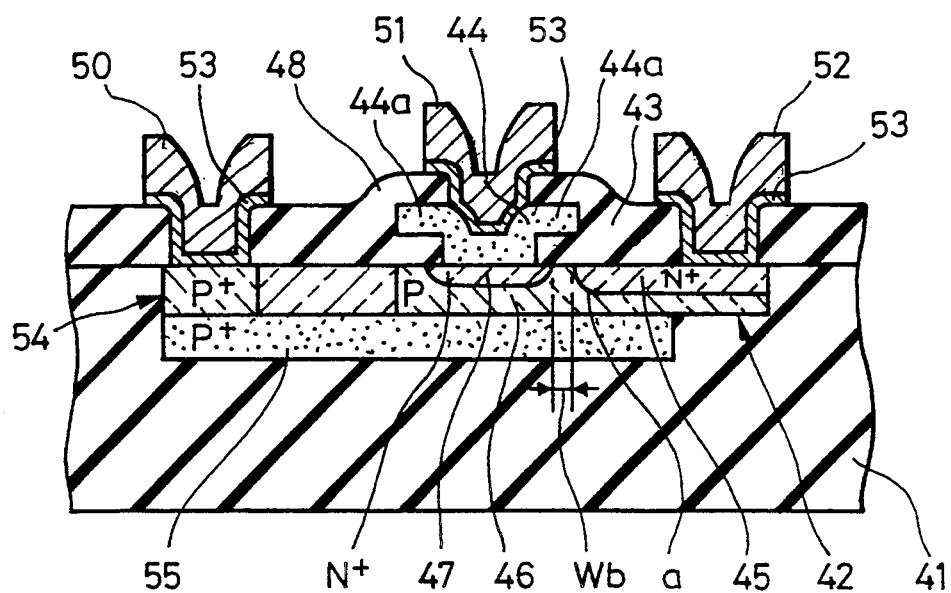
Figure 8B:
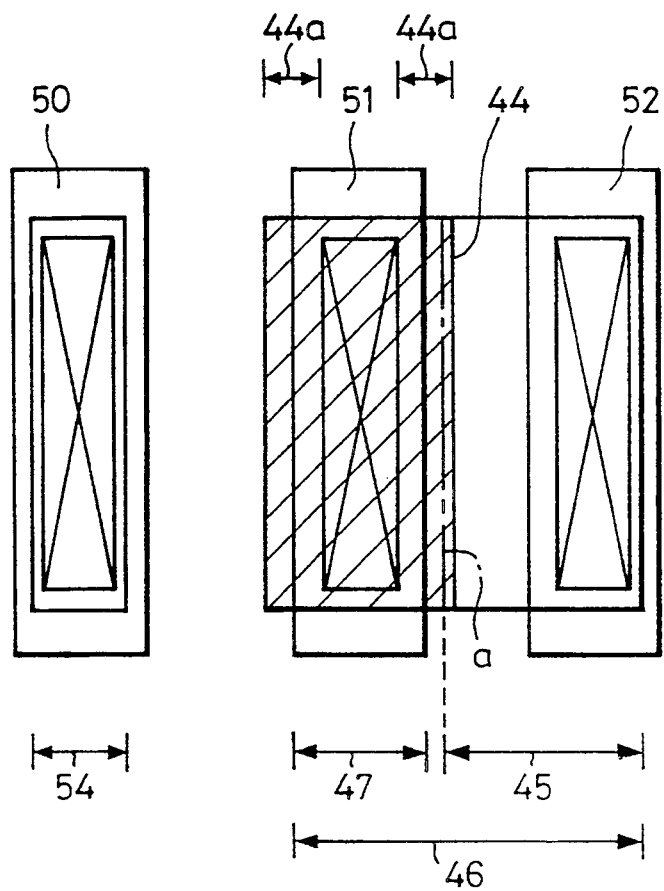
Figure 9A:
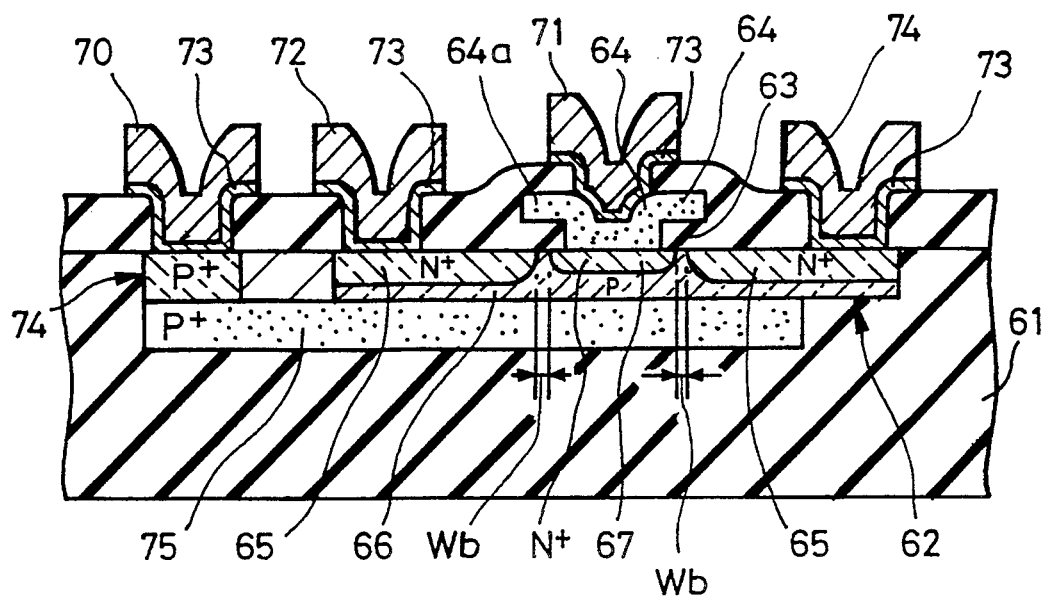
Figure 9B:
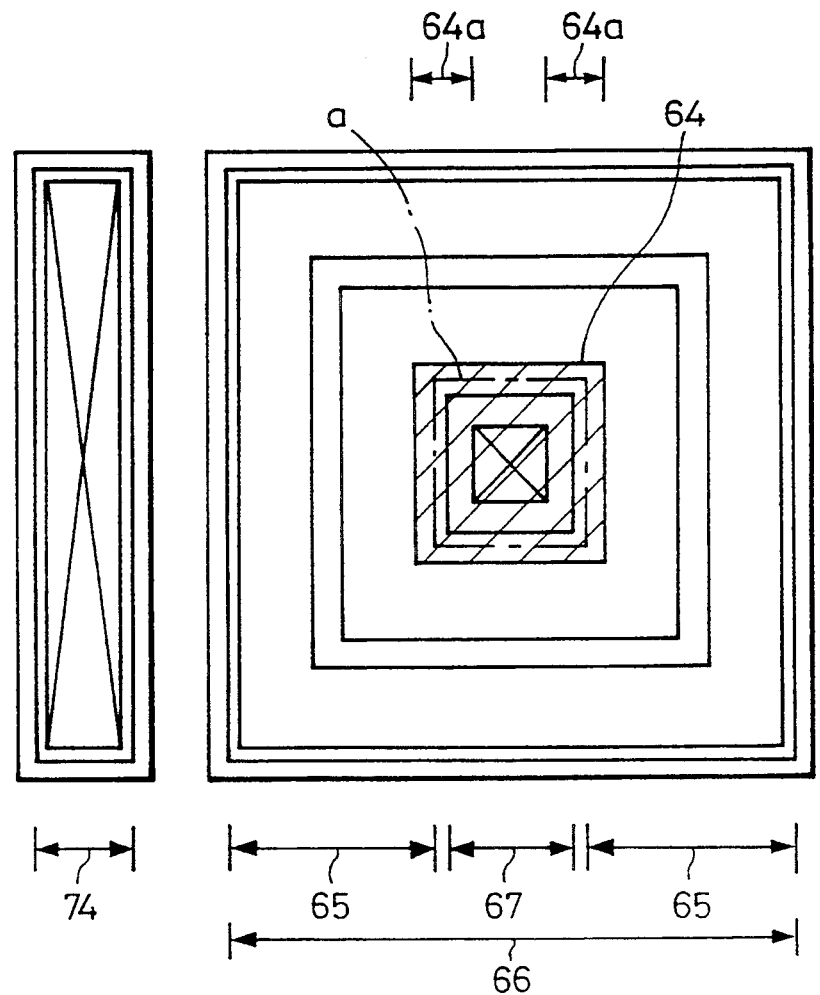
Figure 10A:
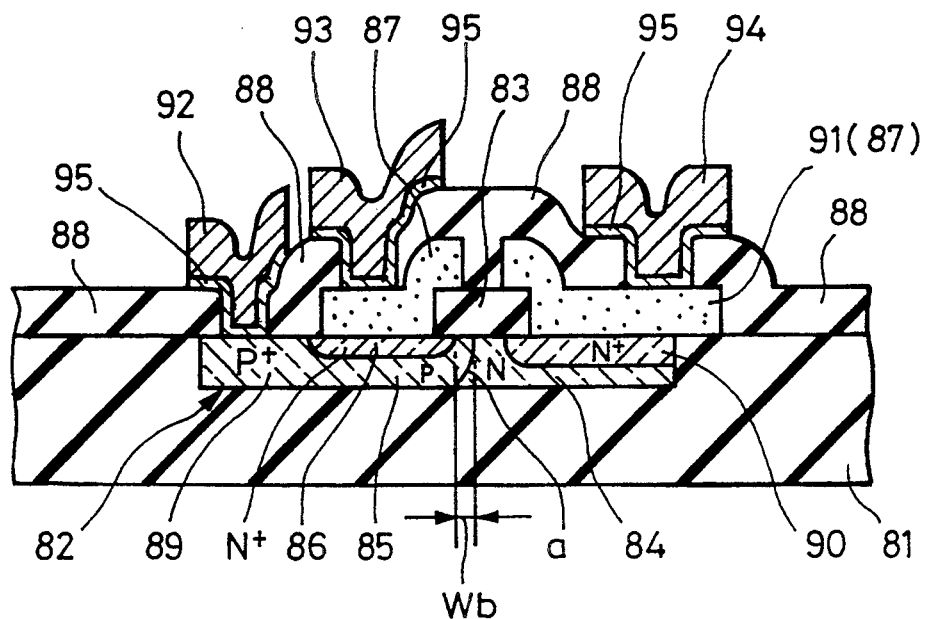
Figure 10B:
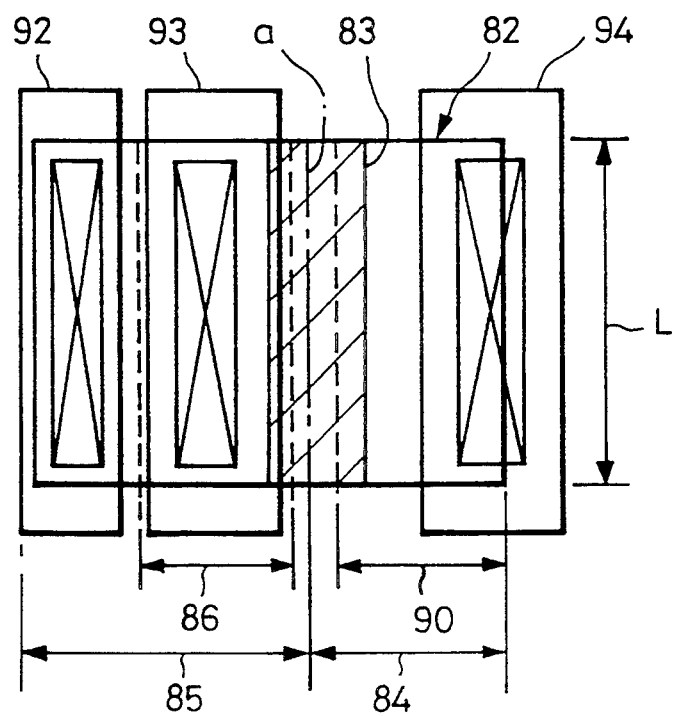
Figure 11:
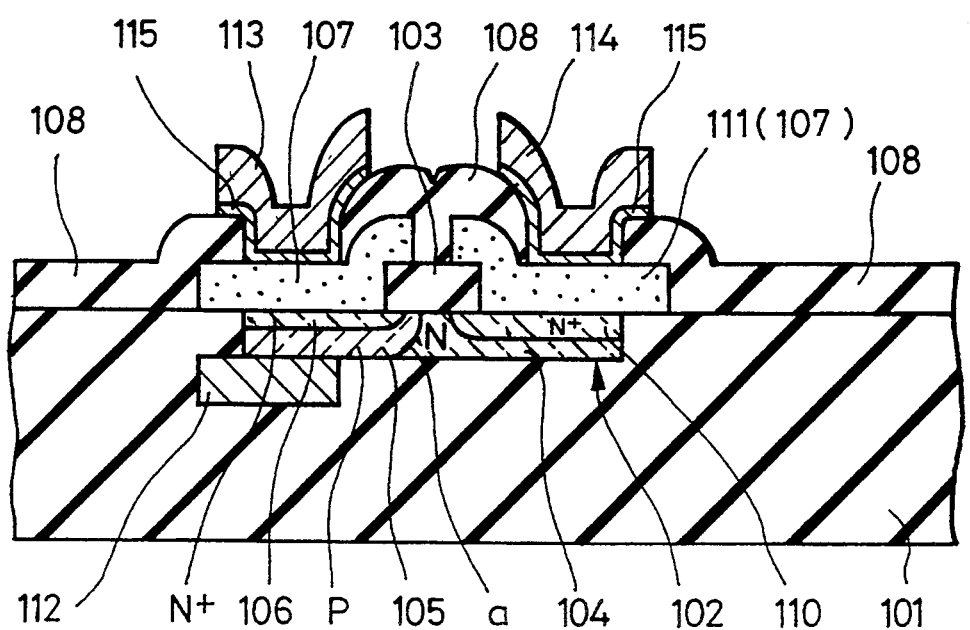
Figure 16A:
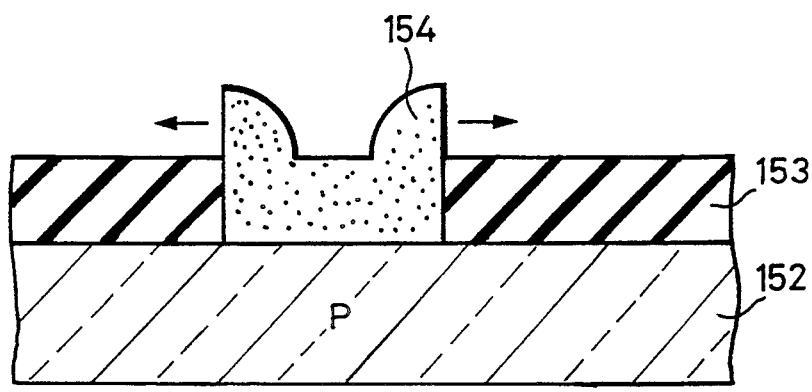
Figure 16B:
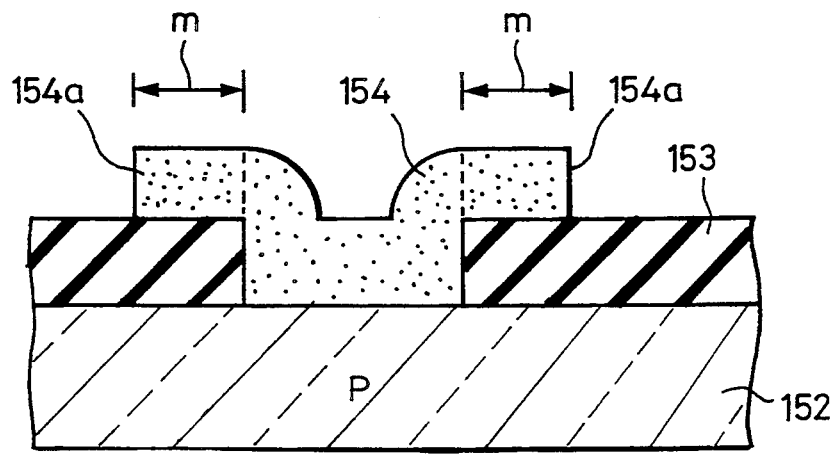

according to a first embodiment of the present invention and a plan view thereof;

FIGS. 8A and 8B are respectively a cross sectional view showing a structure of the transistor according to a second embodiment of the present invention and a plan view thereof;

FIGS. 9A and 9B are respectively a diagrammatic view of a section showing a structure of the transistor according to a third embodiment of the present invention and a plan view thereof;

FIGS. 10A and 10B are respectively a diagrammatic view of a section showing an SOI lateral bipolar transistor (hereinafter simply referred to as a transistor) according to a fourth embodiment of the present invention and a plan view thereof;

FIG. 11 is a diagrammatic view of a section showing a structure of the transistor according to a fifth embodiment of the present invention;

FIGS. 12A, 12B, 12C, 13A, 13B, 13C, 14A, 14B, 14C, 15A, 15B are respectively process diagrams showing a manufacturing method that can realize the transistor according to the first embodiment of the present invention;

FIGS. 16A and 16B are respectively diagrams used to explain a selective CVD method according to the present invention;

FIGS. 17A, 17B, 17C, 18A, 18B, 18C, 19A, 19B, 19C, 20A, 20B, 20C are respectively process diagrams showing a manufacturing method which can realize the transistor according to the second embodiment of the present invention;

FIGS. 21A, 21B, 21C, 22A, 22B, 22C, 23A, 23B, 23C are respectively process diagrams showing a manufacturing method which can realize the transistor according to the fourth embodiment of the present invention; and FIGS. 24A, 24B, 24C, 25A, 25B, 25C, 26A, 26B are respectively process diagrams showing a manufacturing method which can realize the transistor according to the fifth embodiment of the present invention.

DETAILED DESCRIPTION OF THE PREFERRED EMBODIMENTS

Embodiments of the present invention will now be described with reference to the drawings.

Figure 7A:
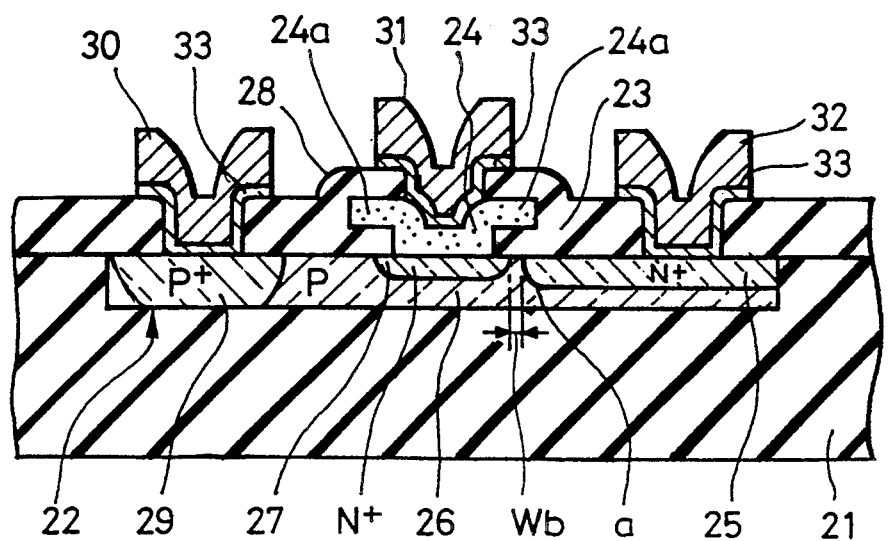
FIGS. 7A and 7B are respectively a cross-sectional view showing a structure of a lateral type bipolar transistor (hereinafter simply referred to as a transistor)
Figure 7B:
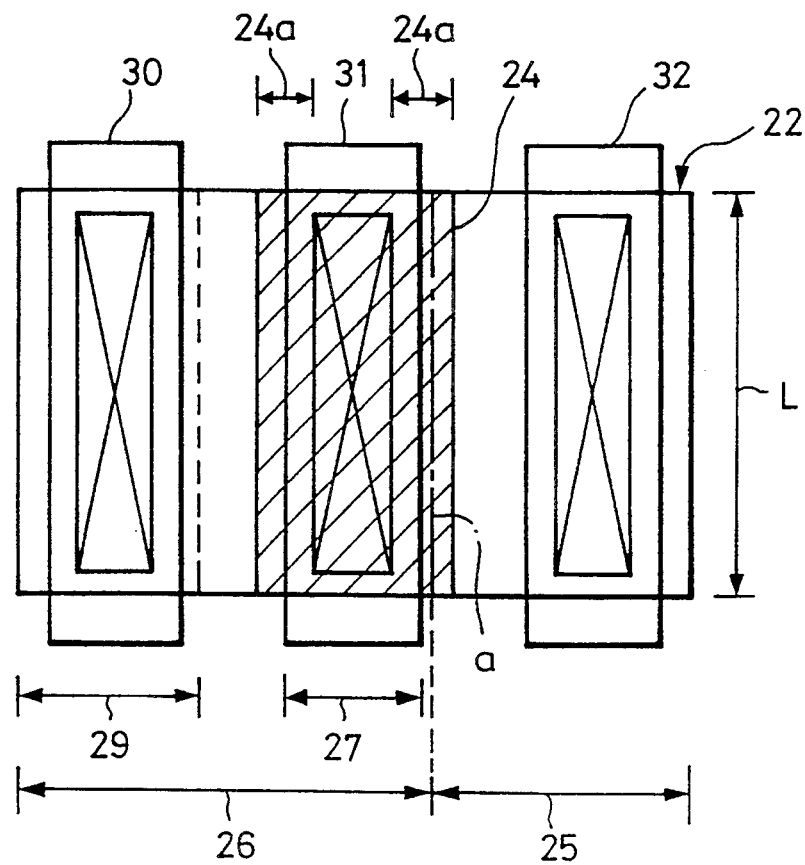

FIG. 7A of the accompanying drawings is a cross-sectional view showing a structure of an SOI lateral NPN transistor (hereinafter simply referred to as a transistor) according to a first embodiment of the present invention. FIG. 7B of the accompanying drawings shows plan view thereof. The transistor of this embodiment is fabricated within an element forming region 22 surrounded from its side portion to its lower portion by an insulating layer 21. Particularly, according to this embodiment, a polycrystalline silicon layer 24 that serves as an emitter diffusion source is formed on the element forming region 22 at its portion corresponding to the opening portion of an interlayer 23. As shown hatched in FIG. 7B, the polycrystalline silicon layer 24 is formed over the entire width of the element forming region 22 at substantially the central portion of the longitudinal direction of the element forming region 22.

A part of the polycrystalline silicon layer 24 is overgrown in the lateral direction over the interlayer 23. A bonding surface a (as shown by a one-dot chain line in FIG. 7B) between an N-type collector region 25 and a P-type base region 26 exists under the overgrown portion 24a. An emitter region 27 is formed by the diffusion of N-type impurity from the polycrystalline silicon layer 24.

In FIGS. 7A and 7B, reference numeral 28 designates an interlayer insulator, 29 a base deriving region, 30, 31 and 32 a base electrode, an emitter electrode and a collector electrode formed of Al layers and 33 a barrier metal.

According to the first embodiment of the present invention, since the bonding surface a between the base region 26 and the collector region 25 exists under the overgrown portion 24a of the polycrystalline silicon layer 24, the bonding surface a and the diffusion end of the emitter region 27 can be made close to each other, thereby reducing the base width Wb. Further, since the emitter region 27 is surrounded by the base region 26, a width (area) of the path from the bonding surface a to the base electrode 30 can be increased and therefore a base resistance Rb can be reduced.

In particular, if lengths of the emitter region 27, the base region 26 and he collector region 25 in the respective longitudinal directions are set to be substantially an equal length L, then the base resistance Rb can be reduced more. Hence, the transistor can be operated at high speed over the entire current region.

A structure of the transistor according to a second embodiment of the present invention will be described with reference to FIGS. 8A and 8B of the accompanying drawings.

While the transistor of the second embodiment has substantially the same structure as that of the first embodiment, it is different in that a base electrode 50 is formed on a deriving region 54 formed on other portion than the element forming region 42 and that the base electrode 50 and a base region 46 formed within the element forming region 42 are connected together via a conductive layer 55 formed on the under layer of the base region 46. According to the above structure, since the base deriving path within the base region 46 is reduced and therefore the base resistance Rb can be reduced more.

A structure of the transistor according to a third embodiment of the present invention will be described with reference to FIGS. 9A and 9B of the accompanying drawings.

While the transistor according to the third embodiment has substantially the same structure as that of the transistor according to the second embodiment, as shown in the plan view of FIG. 9B, it is different in that a collector region 65 is formed in an annular fashion so as to surround an emitter region 67 formed on a base region 66. According to the structure of the transistor of the third embodiment, the base resistance Rb can of course be reduced and a peripheral length between the emitter-collector path that determines the current capacity can be set to be sufficiently long, thereby making it possible to obtain a large current capacity.

Fourth and fifth embodiments of the present invention will be described below.

FIG. 10A of the accompanying drawings shows a structure of an SOI lateral type NPN transistor (hereinafter simply referred to as a transistor) according to the fourth embodiment of the present invention. FIG. 10B of the accompanying drawings is a plan view thereof.

This transistor is fabricated within an element forming region 82 surrounded from its side portion to its lower portion by an insulating layer 81. A bonding surface a (shown by a one-dot chain line in FIG. 10B) between an N-type collector region 84 and a P-type base region 85 exists under an insulating layer 83 (shown hatched in FIG. 10B) of a rectangular configuration (in plan view) formed on the central portion of the upper surface of the element forming region 82. An emitter region 86 is formed by the diffusion process of N-type impurity from a polycrystalline silicon layer 87 formed so as to include a part of the upper surface of the insulating layer 83.

In FIGS. 10A and 10B, reference numeral 88 designates an interlayer insulator, 87 a base deriving region, 90 a collector deriving region, 91 a collector deriving electrode formed of the polycrystalline silicon layer 87, 92, 93, 94 a base electrode, an emitter electrode and a collector electrode formed of Al layers, and 95 a barrier metal.

According to the above structure, since the bonding surface a between the base region 85 and the collector region 84 exists under the insulating layer 83, the bonding surface a and the diffusion end of the emitter region 86 can be made close to each other, thereby reducing the base width Wb. Further, since the emitter region 86 is surrounded by the base region 85, the width (area) of the path from the bonding surface a to the base electrode 92 can be increased. Hence, the base resistance Rb can be reduced.

Particularly, as shown in FIG. 10B, if the lengths of emitter region 86, the base region 85 and the collector region 84 in the respective longitudinal directions are set to be substantially equal the length L, then the base resistance Rb can be reduced more and the operation speed of the transistor can be increased over the whole current region.

A structure of the transistor according to the fifth embodiment of the present invention will be described with reference to FIG. 11 of the accompanying drawings.

Although the transistor of this embodiment has substantially the same structure as that of the first embodiment, it is different in that a base electrode 112 is formed under a base region 105. According to the above-mentioned structure, an area necessary to form the base electrode 112 on the upper surface is not needed so that the cell area can be reduced as compared with the first embodiment. Further, since the base deriving path is reduced, the base resistance Rb can be reduced.

A manufacturing method that can realize the transistor according to the first embodiment will be described with reference to FIGS. 12 to 15 of the accompanying drawings.

Figure 12A:
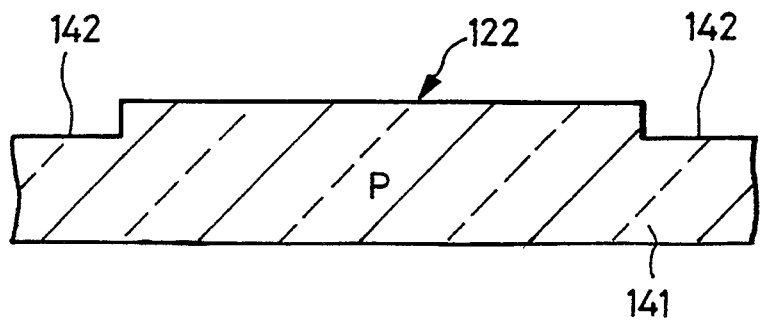

As shown in FIG. 12A, a P-type silicon substrate 141 (crystal orientation <111>) whose impurity concentration lies in a range of from $1 \times 10^{16}$ to $1 \times 10^{17} cm^{-2}$ order is prepared and an area other than a portion which serves as an element forming region 122 is removed by a depth of about 150 nm by the etching process to thereby form a stepped portion 142.

Figure 12B:
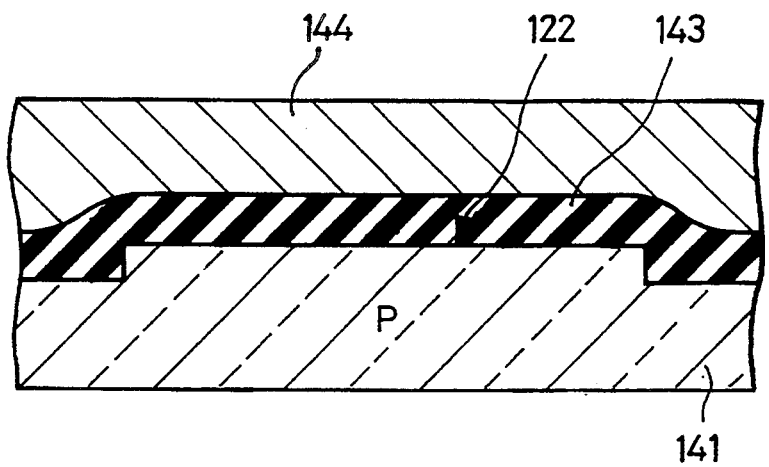

Then, as shown in FIG. 12B, after an SiO$_2$ layer 143 was formed on the whole surface by the CVD method, a planarized layer (resist film or the like) 144 is formed on the whole surface.

Figure 12C:
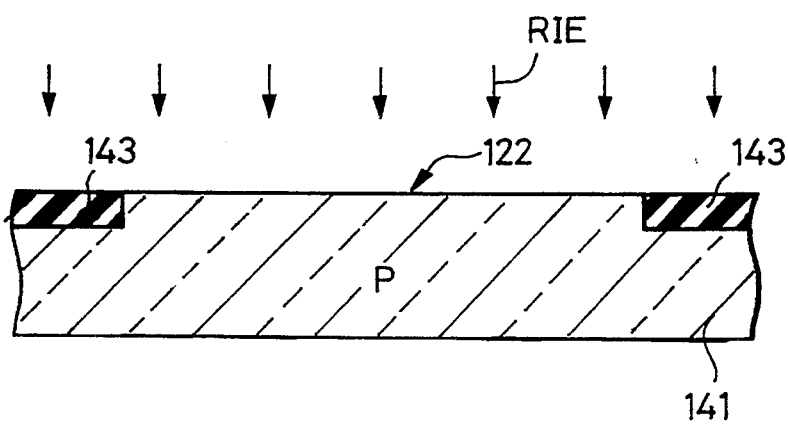

Then, as shown in FIG. 12C, the whole surface is treated by the etch-back process based on the RIE (reactive etching process) to thereby expose a portion which becomes the element forming region 122. At that time, the SiO$_2$ layer 143 is buried into the stepped portion 142. The SiO$_2$ layer 143 serves as a polishing stopper that is used in the succeeding polishing process. Accordingly, the thickness of the SOI substrate (more precisely, the thickness of the element forming region 122) is determined by the stepped portion 142 that was formed according to the process shown in FIG. 12A.

As shown in FIG. 13A, another silicon substrate 146 in which a thermal oxide layer (SiO$_2$ layer) 145 was formed on the surface is prepared. The silicon substrates 141 and 146 are bonded together while the surface N$_n$ which the portion serving as the element forming region 122 was exposed and the surface of the thermal oxide layer 145 are being opposed, thereby a bonded substrate 147 being manufactured. The above bonding treatment can be effected by heat-treating both the silicon substrates 141 and 146 at 1000° C. for several hours in the atmosphere of nitrogen (N$_2$) after the two silicon substrates 141 and 14 were bonded together.

Then, as shown in FIG. 13B, the end face of the silicon substrate 141 is treated by the grinding and polishing treatment and is finally treated by the selective polishing treatment formed of a combination of the etching action and the mechanical polishing to expose the SiO$_2$ layer 143, thereby an SOI substrate 148 being obtained. At that time, the silicon thin layer surrounded from its side portion to its lower portion by the SiO$_2$ layer 143 and the thermal oxide layer 145, i.e., the element forming region 122 is formed. The conditions for the above selective polishing process are that an etchant is formed of ethylenediamine and water (pH is nearly equal to about 10 to 11) and that a temperature is selected to be substantially a room temperature (20° C.). Further, a cross pressure is about 200 g/cm$^{-2}$ and a cross peripheral speed is about 150 m/min.

Then, as shown in FIG. 13C, after the interlayer 123 having a thickness of about 50 nm made of SiO$_2$, for example, was formed on the whole surface by the CVD method, a photoresist film 149 is formed on the whole surface. Thereafter, an opening 149a is formed on the portion corresponding to a portion which serves as the emitter region 127 by the exposure and development treatment. Then, the interlayer 123, exposed through the opening portion 149a, is removed by the etching process to form the opening portion 123a which communicates the element forming region 122.

Figure 14A:
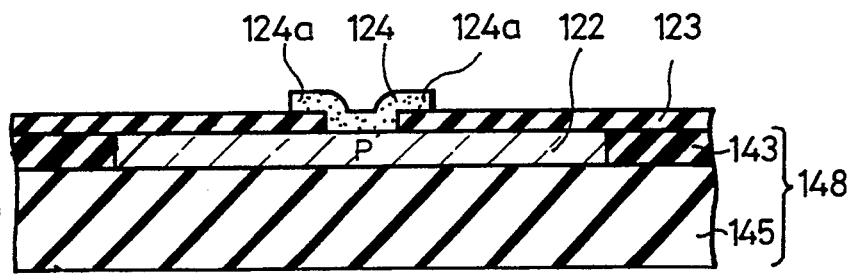

As shown in FIG. 14A, after the above photoresist film 149 was removed, a polycrystalline silicon layer 124 having a thickness of about 200 nm is formed. At that time, it is desirable that the polycrystalline silicon layer 124 is formed by the selective CVD method. That is, the selective CVD method is effected by using a mixed gas of HCl gas and SiH$_4$ gas. As shown in FIG. 16A, by properly controlling the amounts of the HCl gas and the SiH$_4$ gas, the polycrystalline silicon layer 124 is not grown on an interlayer 153 and is grown only on an element forming region (Si layer) 152.

A polycrystalline silicon layer 154 grown above the upper surface of the interlayer 153 is grown in such a fashion that it is overgrown over the interlayer 153 in the lateral direction on the basis of the exposed side wall. Accordingly, by controlling the selective CVD method by time, an overgrown amount m of the polycrystalline silicon layer 124 in the lateral direction can be controlled with high accuracy and satisfactory reproducibility (this selective CVD method is generally referred to as a lateral overgrowth technique).

If the polycrystalline silicon layer 154 is treated by the patterning process in the photolithography process after the polycrystalline silicon layer 154 was formed on the whole surface by the normal CVD method, then the above overgrown amount m of the polycrystalline silicon layer 154 is fluctuated by a misalignment (±0.1 μm) in the photolithography technique and a reproducibility of the base width Wb is deteriorated as will be described later on.

Figure 14B:
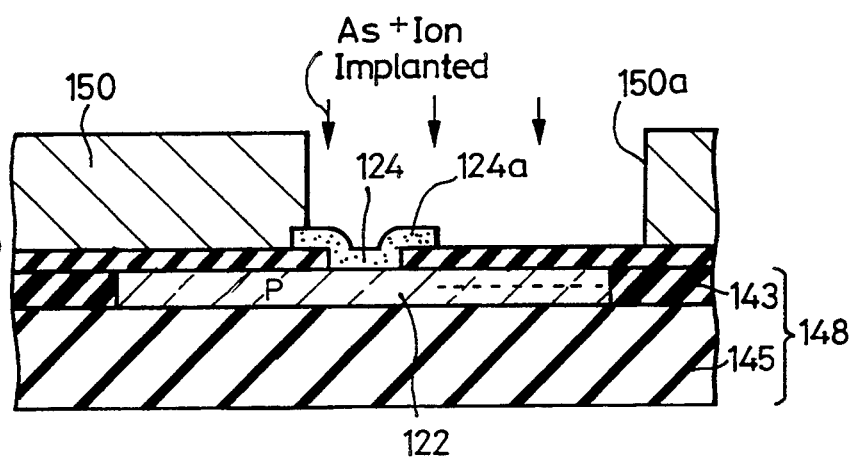

Then, as shown in FIG. 14B, after a photoresist layer 150 was formed on the whole surface, an opening portion 150a is formed on a portion corresponding to one side of the element forming region 122 by the exposure and development treatment. In particular, the opening portion 150a is formed such that the polycrystalline silicon layer 124 is exposed through the opening portion 150a. Thereafter, employing the photoresist layer 150 and the polycrystalline silicon layer 124 as masks, impurity for forming N-type emitter and collector, i.e., As+ ion is implanted.

By this ion implantation process, the N-type impurity is more deeply introduced into one side of the element forming region 122 at its portion where the polycrystalline silicon layer 124 is not formed, i.e., a portion which becomes the collector region 125. In this case, the N-type impurity is also introduced into the polycrystalline silicon layer 124. The conditions for this ion implantation are selected as an implantation energy=100 keV and an implanted amount=$2 \times 10^{16} cm^{-2}$, respectively.

Figure 14C:
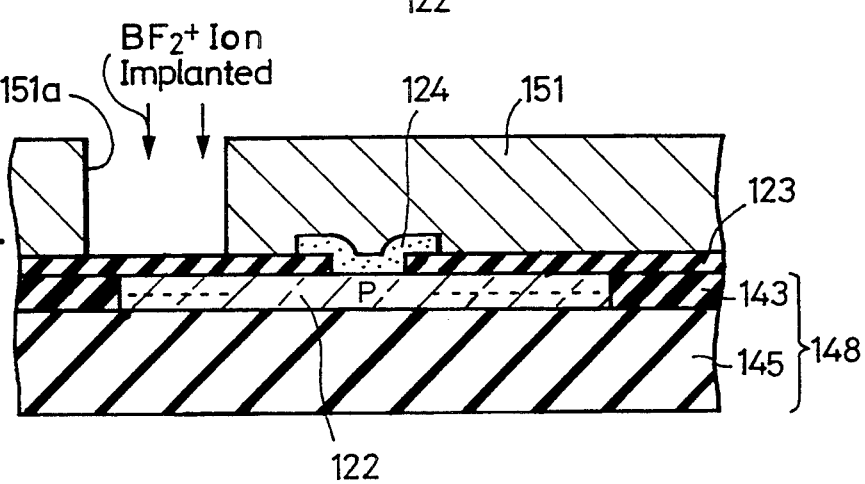

Then, as shown in FIG. 14C, after the photoresist layer 150 was removed, a photoresist layer 151 is formed again. Thereafter, an opening portion 151a is formed on the other side of the element forming region 122, i.e., on the portion corresponding to the portion which becomes the base deriving region 129 by the exposure and development treatment. In this case, the polycrystalline silicon layer 124 is covered with the photoresist layer 151 so as to prevent the polycrystalline silicon layer 124 from being exposed through the opening portion 151a.

Thereafter, impurity for forming a P-type base deriving region, e.g., $BF_2^+$ ion is implanted on the other side of the element forming region 122 through the opening portion 151a of the photoresist layer 151. The ion implantation conditions are selected as the implantation energy=30 keV and the implanted amount=$1 \times 10^{15} cm^{-2}$, respectively.

Figure 15A:
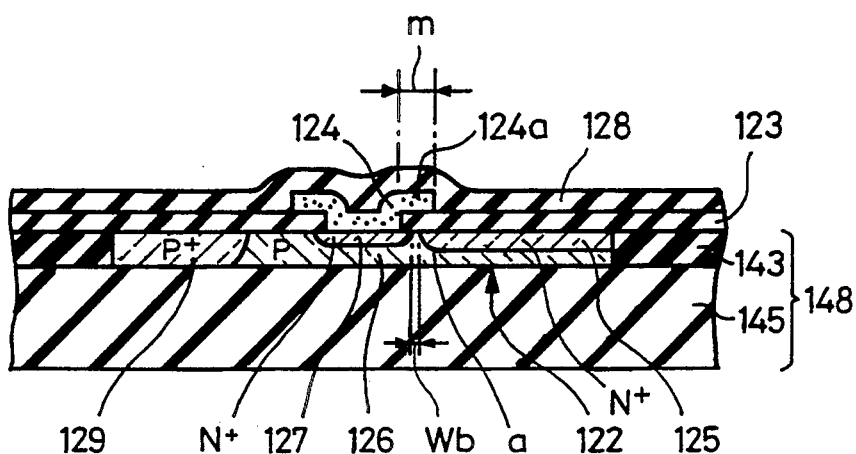

As shown in FIG. 15A, after the photoresist layer 151 was removed, an interlayer insulator 128 having a thickness of about 200 nm made of $SiO_2$, for example, is formed on the whole surface by the CVD method. Thereafter, the product is treated by the heat treatment at a temperature of from 800° to 900° C. for 30 minutes in a diffusion furnace, whereafter the product is further treated by a lamp anneal process at a temperature of from 1000 to 1100° C. for several 10s of seconds.

According to the above continuous heat treatment, N-type impurity implanted on one side of the element forming region 122 is diffused to form the N-type collector region 125. Also, a relatively shallow N-type emitter region 127 is formed by the diffusion of N-type impurity from the polycrystalline silicon layer 124. Simultaneously, P-type impurity implanted on the other side of the element forming region 122 is diffused to form a P-type base deriving region 129. In the element forming region 122, other portion that the collector region 125, the emitter region 127 and the base deriving region 129 becomes a base region 126.

At that time the bonded surface a between the base region 126 and the collector region 125 exists under the overgrown portion 124a of the polycrystalline silicon layer 124 and a collector-base withstand voltage is determined by the overgrown amount m of the overgrown portion 124a. The base width Wb also is determined by the overgrown amount m of the polycrystalline silicon layer 124 in a self-alignment fashion.

Figure 15B:
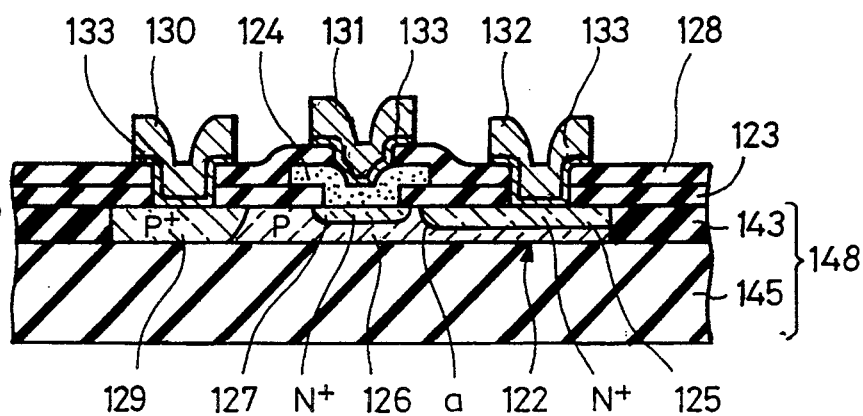

As shown in FIG. 15B, after opening portions are formed on the interlayer insulator 128 at its portions corresponding to the base deriving region 129, the polycrystalline silicon layer 124 and the collector region 125 by the RIE process, for example, a barrier metal 133 made of TiN/Ti and an Al layer are formed by the sputtering process. Thereafter, the barrier metal 133 and the Al layer are treated by the patterning process, whereby a base electrode 130, an emitter electrode 131 and a collector electrode 132, each being made of Al layer are formed. Thus, the transistor according to the first embodiment of the present invention is obtained.

According to this manufacturing method, the collector region forming impurity is introduced into the other side of the element forming region 122 under the condition that the polycrystalline silicon layer 124 on the P-type element forming region 122 (base region 126) is employed as the mask. Further, when the above impurity is introduced, the impurity is also introduced into the polycrystalline silicon layer 124 so that the polycrystalline silicon layer 124 becomes the emitter diffusion source. Therefore, in the succeeding heat treatment, for example, the impurity implanted on the element forming region 122 and the impurity within the polycrystalline silicon layer 124 are diffused doubly to thereby form the collector region 125 and the emitter region 127, respectively.

Accordingly, by controlling the double diffusion of these impurities by time, for example, the narrow base width Wb can be formed with satisfactory reproducibility and the emitter region 127 can be surrounded by the base region 126, which leads to the reduction of the base width Wb and the reduction of the base resistance Rb. Therefore, the transistor according to the first embodiment of the present invention can be operated at high speed over the whole current region.

A manufacturing method that can realize the transistor according to the second embodiment of the present invention will be described with reference to FIGS. 17 to 20.

Figure 17A:
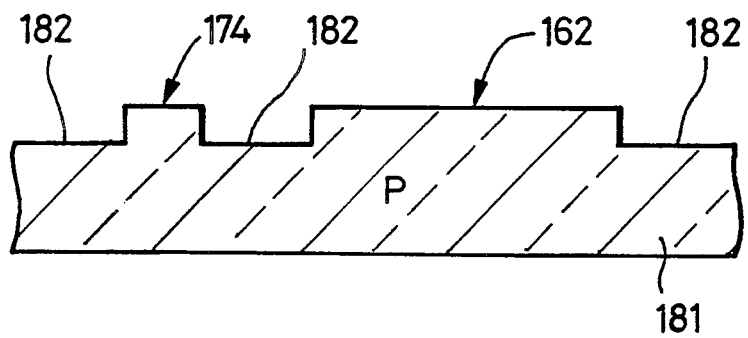

As shown in FIG. 17A, a P-type silicon substrate 181 (crystal orientation<111>) whose impurity concentration lies in a range of from $1 \times 10^{16}$ to $1 \times 10^{17} cm^{-2}$ order is prepared and other portion than the portions which serve as an element forming region 162 and a deriving region 174 is removed by a thickness of 150 nm by the etching process to thereby form a stepped portion 182.

Figure 17B:
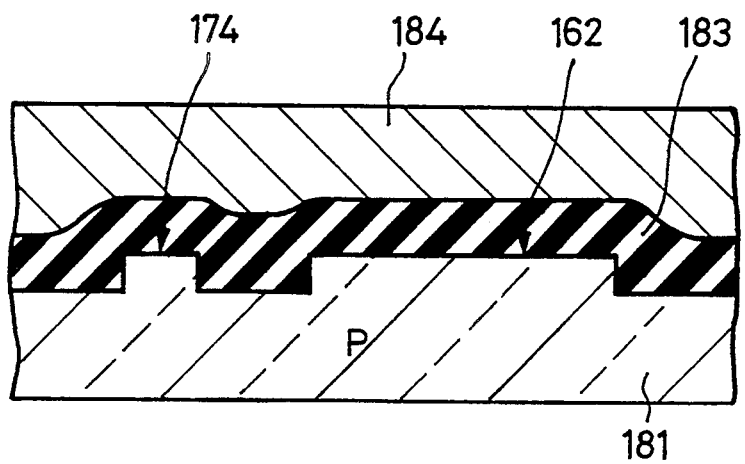

Then, as shown in FIG. 17B, after an $SiO_2$ layer 183 was formed on the whole surface by the CVD method, a planarized layer (photoresist film or the like) 184 is formed on the whole surface.

Figure 17C:
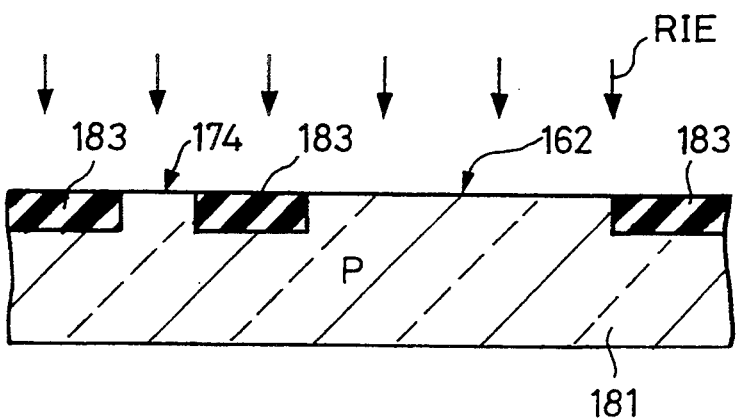

As shown in FIG. 17C, the etch-back treatment is effected on the whole surface according to the RIE process to expose portions which serve as the element forming region 162 and the deriving region 174. At that time, the $SiO_2$ layer 183 is buried into the stepped portion 182. The $SiO_2$ layer 183 serves as a polishing stopper that is used in the succeeding polishing treatment. Accordingly, the thickness of the SOI substrate (precisely, the thickness of the element forming region 162) is determined by the stepped portion 182 formed in the process shown in FIG. 17A.

Figure 18A:
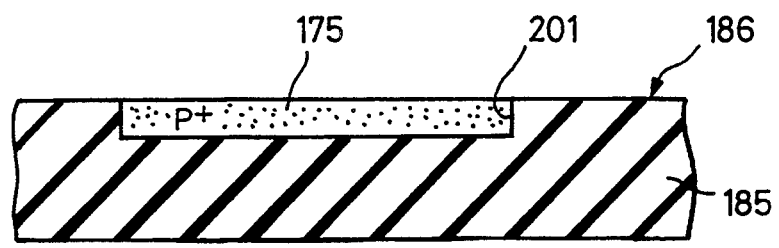

Then, as shown in FIG. 18A, there is prepared another silicon substrate 186 in which a thermal oxide layer (SiO$_2$ layer) 185 was formed on the surface. Thereafter, a concave portion 201 is formed on the element forming region 162 at its portion corresponding to the base region to the deriving region 174 by the etching process such as the RIE process or the like. Then, a conductive layer 175 such as a tungsten silicide layer on which P-type impurity, e.g., Boron (B) is doped or polycrystalline silicon layer or the like is formed and the etch-back process is effected on the whole surface by the RIE process, whereby the conductive layer 175 is buried into the above concave portion 201.

Figure 18B:
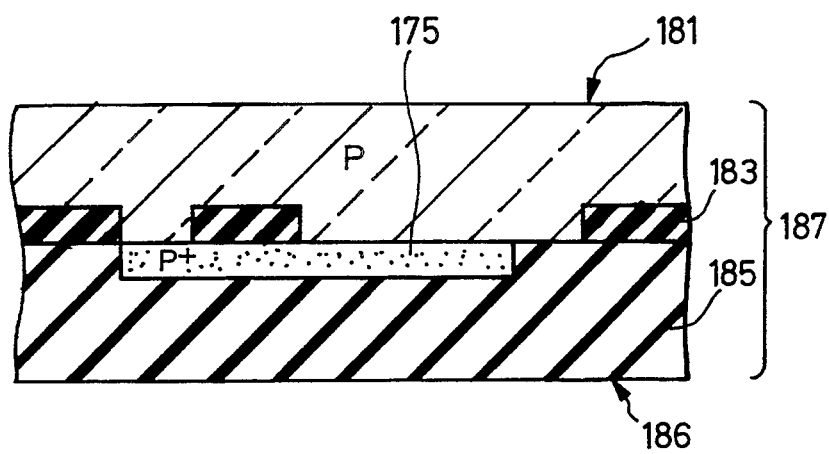

Then, as shown in FIG. 18B, the silicon substrates 181, 186 are bonded together while the surface on which the portion serving as the element forming region 162 is exposed and the surface of the thermal oxide layer 185 are opposed, thereby manufacturing a bonded substrate 187. In this bonding treatment, after the silicon substrates 181 and 186 were bonded, then the product is treated by the heat treatment at 1100° C., in the atmosphere of nitrogen (N$_2$) for several hours, thereby the bonded substrate 187 being manufactured.

Figure 18C:
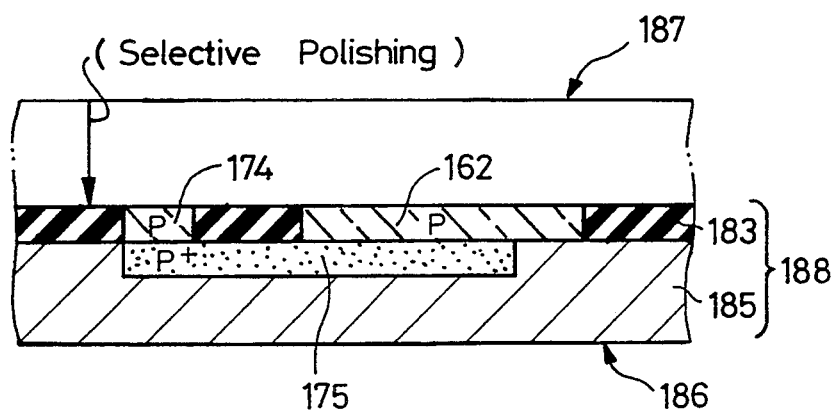

As shown in FIG. 18C, the silicon substrate 181 is ground and polished from the end face thereof and is then finally treated by the polishing process formed by the combination of the etching action and the mechanical polishing to expose the SiO$_2$ layer 183, thereby obtaining an SOI substrate 188. At that time, the silicon thin layers surrounded from its side portion to its lower portion by the SiO$_2$ layer 183 and the thermal oxide layer 185, i.e., the element forming region 162 and the deriving region 174 are formed.

As the selective polishing conditions, the etchant is formed of ethylenediamine and water (pH is nearly equal to about 10 to 11) and a temperature is selected as about a room temperature (20° C.). The cross pressure is about 200 g/cm$^{-2}$ and the cross peripheral speed is about 150 m/min. In the SOI substrate 188 thus manufactured according to this polishing treatment, the element forming region 162 and the deriving region 174 are coupled by the conductive layer 175 which is located below the element forming region 162 and the deriving region 174.

Figure 19A:
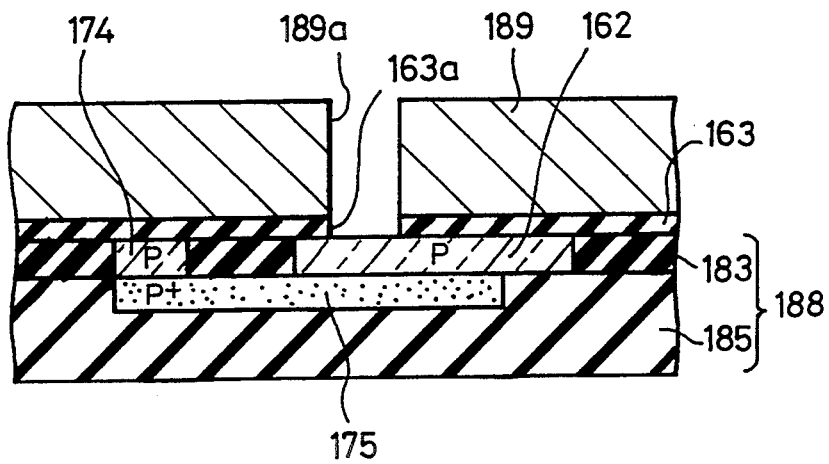

Then, as shown in FIG. 19A, after the interlayer 163 having a thickness of about 50 nm made of SiO$_2$, for example, was formed on the whole surface by the CVD method, a photoresist layer 189 is formed on the whole surface. Thereafter, an opening portion 189a is formed on the portion corresponding to the portion which becomes the emitter region 167 by the exposure and development treatment. Thereafter, the interlayer 163 that is exposed through the opening portion 189a is removed by the etching process to form the opening portion 163a which communicates with the element forming region 162.

Figure 19B:
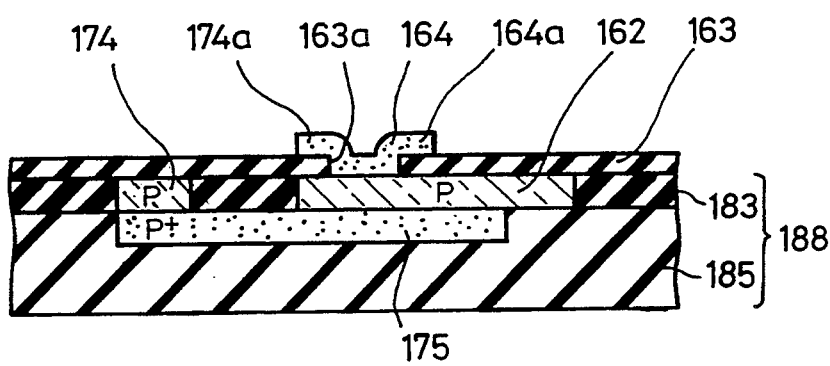

As shown in FIG. 19B, after the photoresist layer 189 was removed, the polycrystalline silicon layer 164 having a thickness of about 200 nm is formed by the selective CVD method (lateral overgrowth technique). At that time, the polycrystalline silicon layer 164 is formed within the opening portion 163a and is grown over the interlayer 163 so as to partly grown in the lateral direction (overgrown portion 164a). The overgrown amount of the overgrown portion 164a can be controlled by the time.

Figure 19C:
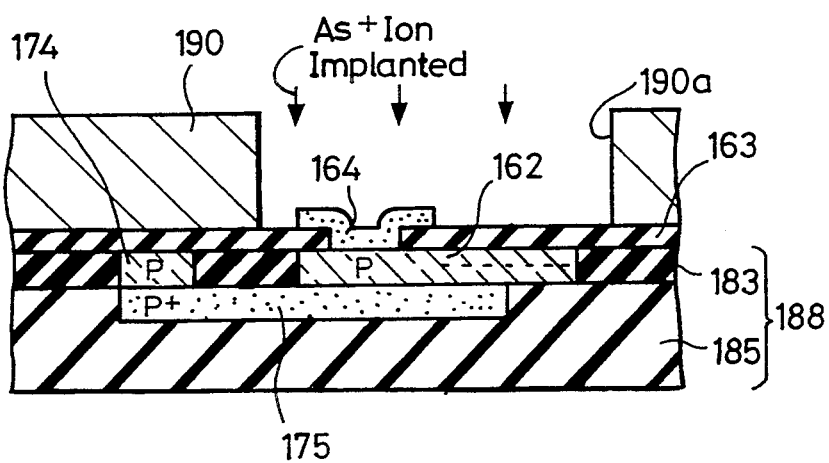

As shown in FIG. 19C, after a photoresist layer 190 was formed on the whole surface, an opening portion 190a is formed on the portion corresponding to one side of the element forming region 162 by the exposure and development treatment. In particular, the opening portion 190a is formed such that the polycrystalline silicon layer 164 is exposed through the opening portion 190a. Thereafter, impurity for forming N-type emitter and collector, i.e., As$^+$ ion is implanted under the condition that the photoresist layer 190 and the polycrystalline silicon layer 164 are employed as the masks.

By this ion implantation, the N-type impurity is more deeply introduced into the portion where the polycrystalline silicon layer 164 is not formed, i.e., the portion which serves as the collector region 165 in one side of the element forming region 162. In this case, the N-type impurity is of course introduced into the polycrystalline silicon layer 164. As the ion implantation conditions, there are selected the implantation energy=100 keV and the implanted amount=$2 \times 10^{16}$cm$^{-2}$, respectively.

Figure 20A:
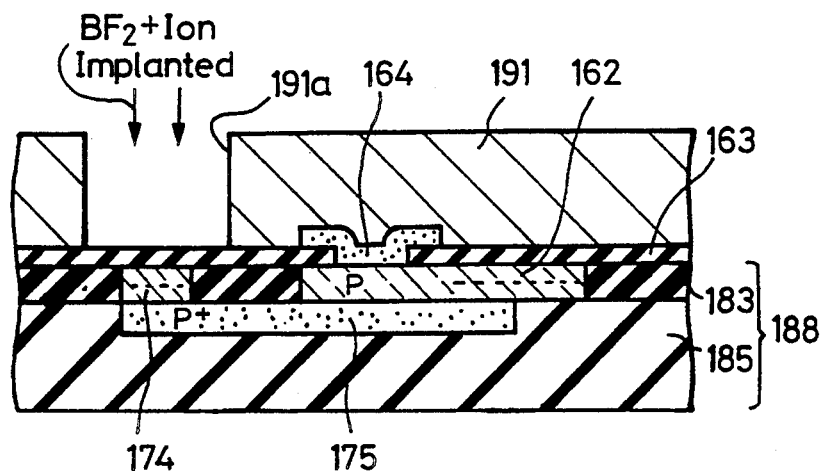

Then, as shown in FIG. 20A, after the above photoresist layer 190 was removed, a photoresist layer 191 is formed again. Thereafter, an opening portion 191a is formed on the portion corresponding to the deriving region 174 by the exposure and development treatment. Then, impurity for forming a P-type base deriving region, e.g., BF$_2^+$ ion is implanted onto the deriving region 174 through the opening portion 191a of the photoresist layer 191. As the conditions of this ion implantation, there are selected the implantation energy=30 keV and the implanted amount=$1 \times 10^{15}$cm$^{-2}$, respectively.

Figure 20B:
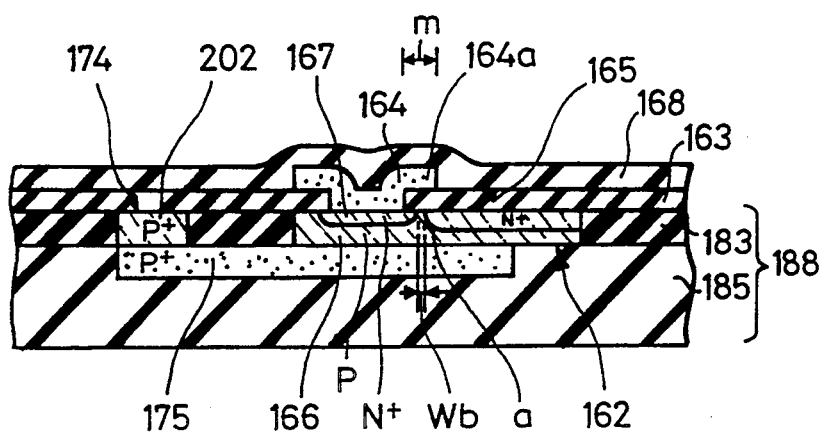

As shown in FIG. 20B, after the photoresist layer 191 was removed, the interlayer insulator 168 having a thickness of about 200 nm made of SiO$_2$ is formed on the whole surface by the CVD method. Thereafter, the product is treated by the heat treatment at a temperature ranging from 800° to 900° C. for 30 minutes in the diffusion furnace, whereafter the product is treated by the lamp anneal treatment at a temperature of from 1000° to 1100° C. for several 10s of seconds.

By this continuous heat treatment, the N-type impurity implanted on one side of the element forming region 162 is diffused to form the N-type collector region 165 and the N-type impurity is diffused from the polycrystalline silicon layer 164 to form the relatively shallow N-type emitter region 167. Simultaneously, the P-type impurity implanted on the deriving region 174 is diffused to form a P-type base deriving region 202. In the element forming region 162, other portion than the collector region 165 and the emitter region 167 becomes the base region 166.

At that time, the bonding surface a between the base region 165 and the collector region 164 exists under the overgrown portion 164a of the polycrystalline silicon layer 164 and the collector-base withstand voltage is determined by the overgrown amount m. Also, the base width Wb is determined by the overgrown amount m of the polycrystalline silicon layer 164 in a self-alignment fashion. The base deriving region 202 and the base region 166 in the element forming region 162 are connected by a conductive layer 175 of an under layer.

Figure 20C:
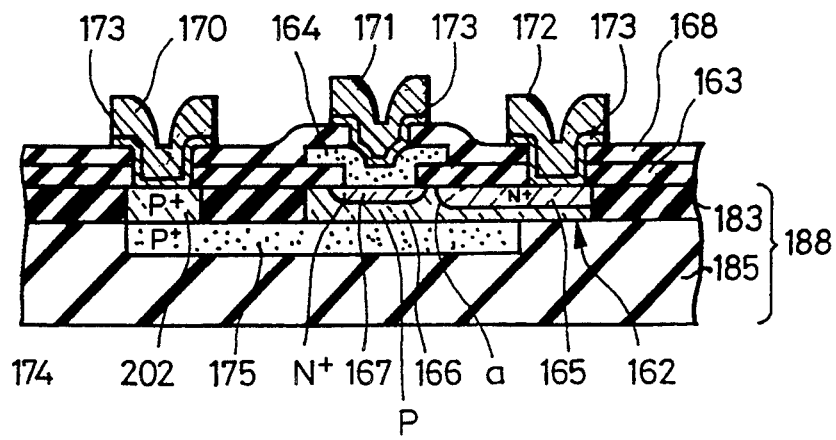

As shown in FIG. 20C, after opening portions were formed on the interlayer insulator 168 at its portions corresponding to the base deriving region 202, the polycrystalline silicon layer 164 and the collector region 165 by the RIE process, for example, a barrier metal 173 made of TiN/Ti and an Al layer are formed by the sputtering process. Thereafter, the barrier metal 173 and the Al layer are treated by the patterning process, whereby the base electrode 170, then emitter electrode 171 and the collector electrode 172, each being made of Al layer are formed. Thus, the transistor according to the second embodiment of the present invention is obtained.

According to this manufacturing method, similarly to the manufacturing method of the first embodiment, by controlling the double diffusion of the emitter and collector forming impurity by time, for example, the narrow base width Wb can be formed with excellent reproducibility and the emitter region 167 can be surrounded by the base region 166, which leads to the reduction of the base width Wb and the reduction of the base resistance Rb. Therefore, the transistor of this embodiment can be operated at high speed over the whole current region.

Further, since the SOI substrate 188 can be fabricated by using the bonding process, the conductive layer 175 which connects the base deriving area 202 formed independently of the element forming region 162 and the base region 166 can be buried into the under layer of the base region 166 with ease. Since the conductive layer 175 is buried as described above, as earlier noted, the base resistance Rb can be reduced more.

The transistor according to the third embodiment of the present invention can be manufactured with ease by effectively utilizing the transistor manufacturing method according to the second embodiment shown in FIGS. 17 to 20.

According to the semiconductor apparatus of the present invention, the base width can be reduced, the base resistance can be reduced and the operation speed in the whole current region can be improved.

Further, according to the manufacturing method of the semiconductor apparatus of the present invention, it is possible to manufacture the semiconductor apparatus with ease in which the base width can be reduced, the base resistance can be reduced and the operation speed in the whole current region can be improved.

Figure 1A:
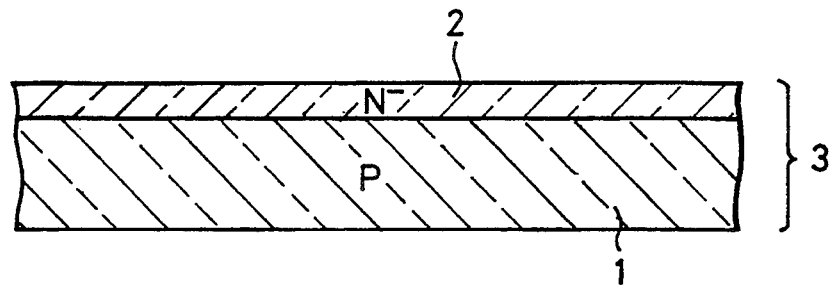
FIGS. 1A and 1B are diagrammatic views of section showing two substrates that should be prepared when an SOI substrate in the SOI bipolar transistor according to an example of the prior art is formed.
Figure 1B:
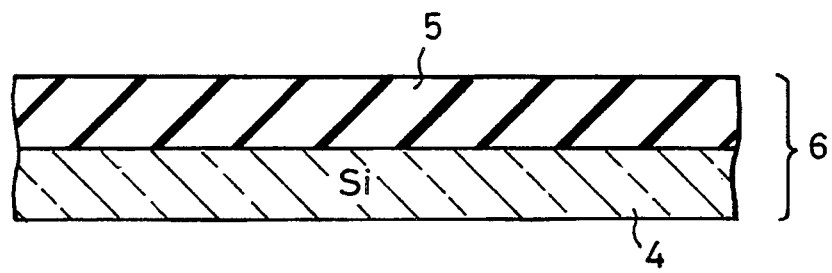
Figure 2:
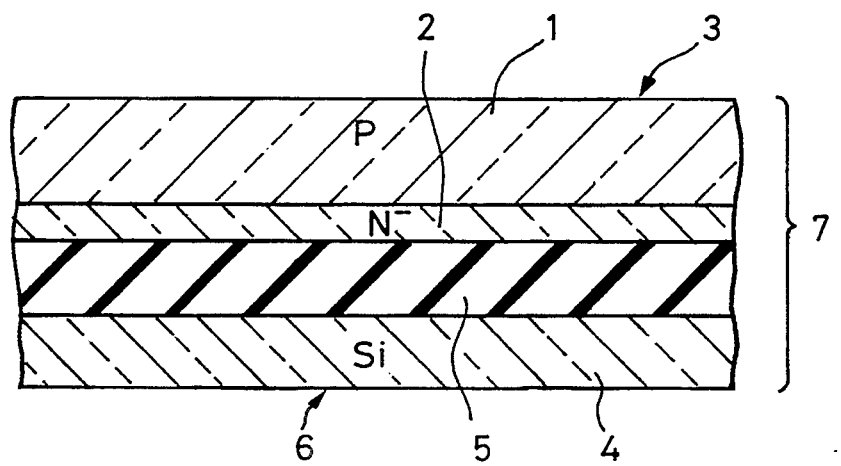
FIG. 2 is a diagrammatic view of a section snowing a conventional bonded substrate.
Figure 5:
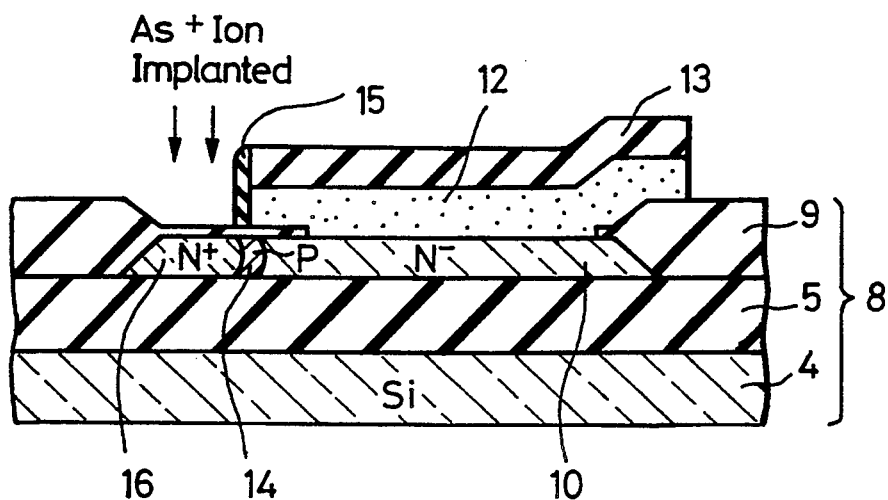
FIG. 5 is a cross-sectional view showing a structure of a transistor according to an example of the prior art.
Figure 6:
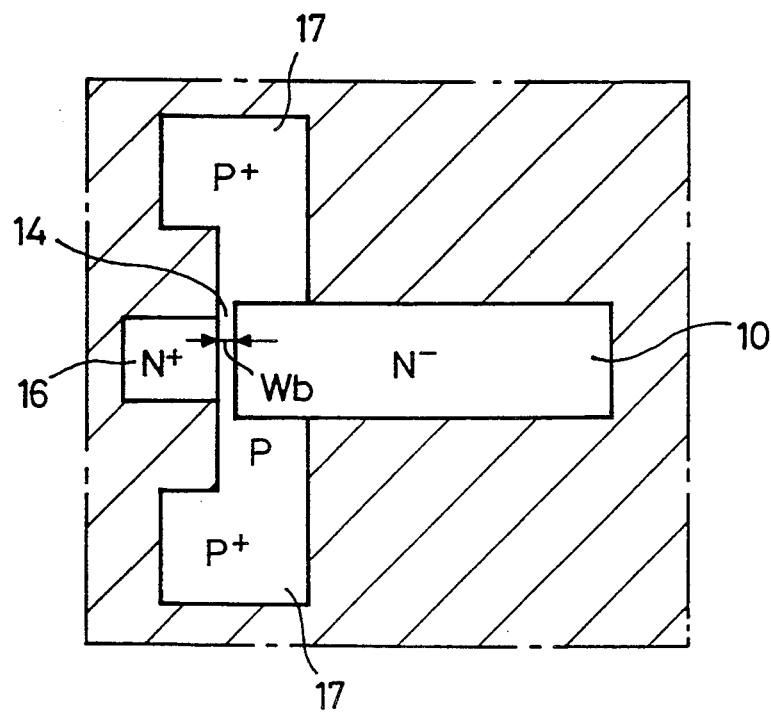
FIG. 6 is a plan view showing a structure according to an example of the prior art.

Two manufacturing methods (first and second manufacturing methods) that can realize the transistor according to the fourth embodiment of the present invention will be described with reference to FIGS. 21 to 25. In FIGS. 21 to 25, like parts corresponding to those of FIG. 1 are marked with the same references and therefore need not be described in detail.

FIGS. 21 to 25 are respectively process diagrams showing the manufacturing method according to the fourth embodiment of the present invention, In these process diagrams, the process diagrams shown in FIGS. 21A to 22B illustrate a manufacturing method of a substrate having an SOI structure (hereinafter simply referred to as an SOI substrate). The process diagrams shown in FIGS. 22C to 23C show the manufacturing method of the transistor according to the fourth embodiment of the present invention. The process of the manufacturing method according to the fourth embodiment of the present invention will be described below sequentially.

Figure 21A:
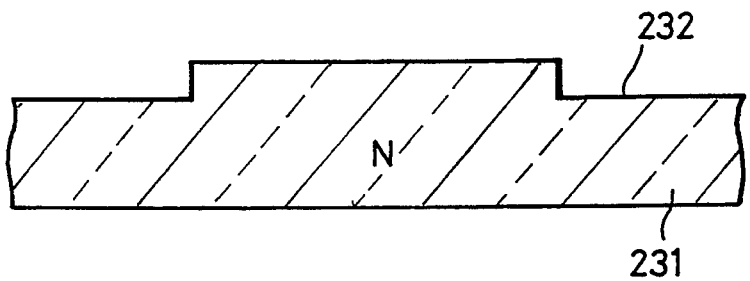

As shown in FIG. 21A, an N-type silicon substrate 231 (crystal orientation <111>) is prepared and other portion than the portions which serve as an element forming region 212 is removed by a thickness of 150 nm by the etching process to thereby form a stepped portion 232.

Figure 21B:
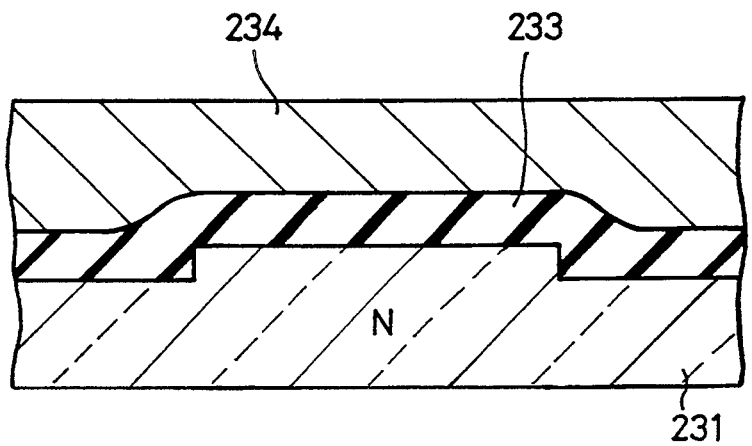

Then, as shown in FIG. 21B, after an $SiO_2$ layer 233 was formed on the whole surface by the CVD method, a planarized layer (photoresist layer or the like) 234 is formed on the whole surface.

Figure 21C:
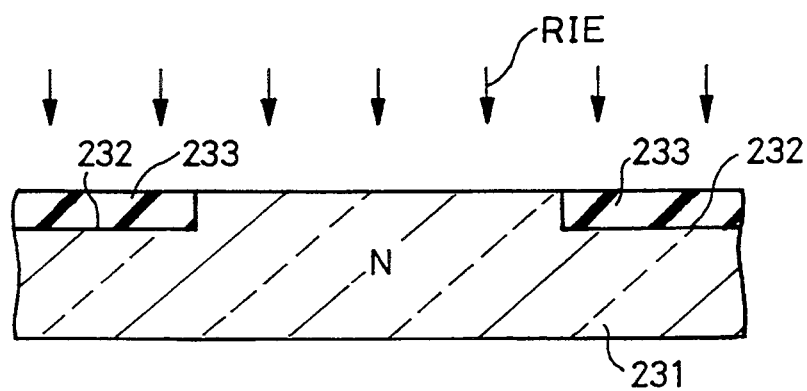

As shown in FIG. 21C, the whole surface is treated by the etch-back treatment by the RIE process to expose a portion which serves as the element forming region 212. At that time, the $SiO_2$ layer 233 is buried into the stepped portion 232. The $SiO_2$ layer 233 serves as a polishing stopper that is used in the succeeding polishing treatment. Accordingly, the thickness of the SOI substrate (precisely, the thickness of the element forming region 212) is determined by the stepped portion 232 formed in the process shown in FIG. 21A.

Figure 22A:
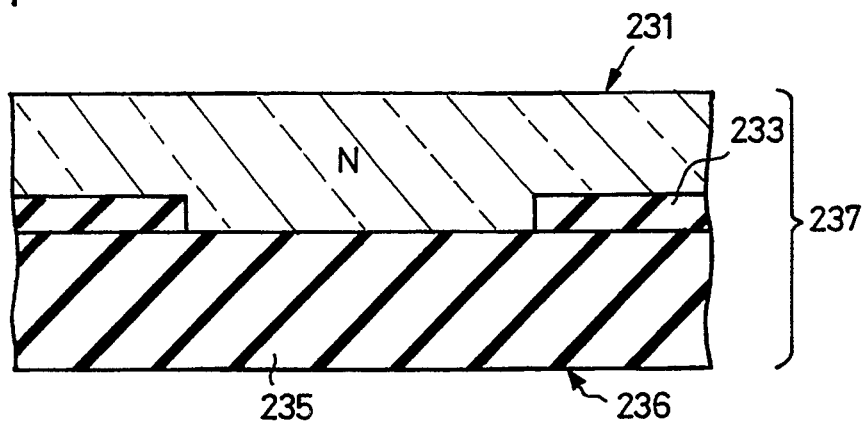

Then, as shown in FIG. 22A, another silicon substrate 236 in which a thermal oxide layer ($SiO_2$ layer) 235 was formed on the surface is prepared. Then, the silicon substrate 231, 236 are bonded together while the surface on which the portion serving as the element forming region 212 was exposed and the surface of the thermal oxide layer 235 are being opposed to each other, thereby manufacturing a bonded substrate 237. In this bonding treatment, after the silicon substrates 231 and 236 were bonded, the product is treated by the heat treatment at 1100° C. in the atmosphere of nitrogen ($N_2$) for several hours, thereby the bonded substrate 237 being manufactured.

Figure 22B:
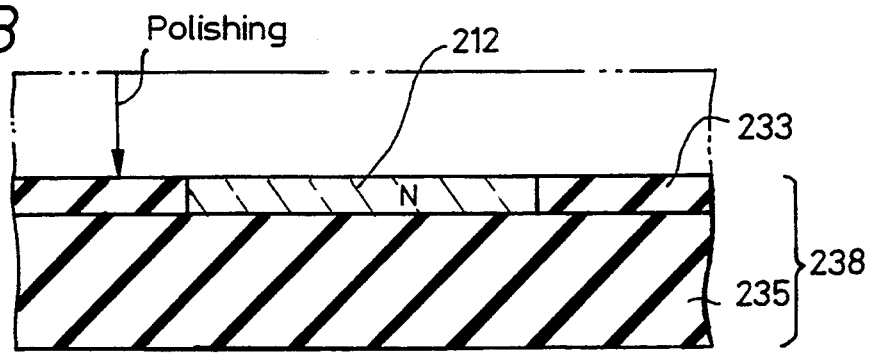

As shown in FIG. 22B, the silicon substrate 231 is ground and polished from the end face thereof and is then finally treated by the polishing process formed by the combination of the etching action and the mechanical polishing to expose the $SiO_2$ layer 233, thereby obtaining the SOI substrate 238. At that time, the silicon thin layer surrounded from its side portion to its lower portion by the $SiO_2$ layer 233 and the thermal oxide layer 235, i.e., the element forming region 212 is formed. As the selective polishing conditions, the etchant is formed of ethylenediamine and water (pH is nearly equal to about 10 to 11) and a temperature is selected as about a room temperature (20° C.). The cross pressure is about 200 g/$cm^{-2}$ and the cross peripheral speed is about 150 m/min.

Figure 22C:
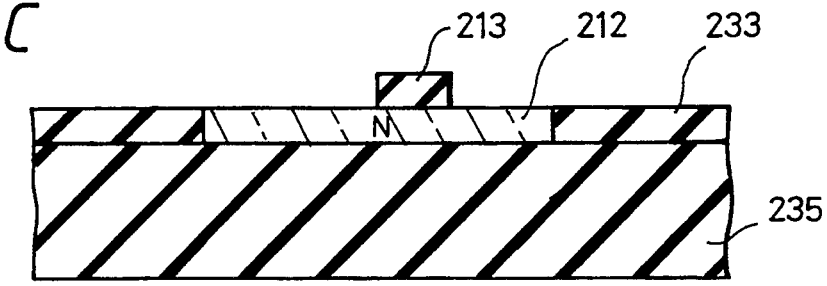

Then, as shown in FIG. 22C, after the insulating layer 213 made of $SiO_2$ was formed on the whole surface by the CVD method, the product is treated by the patterning process such as the RIE process or the like, thereby leaving the pattern (insulating layer) 213 of rectangular configuration on the central portion of the element forming region 212.

Figure 23A:
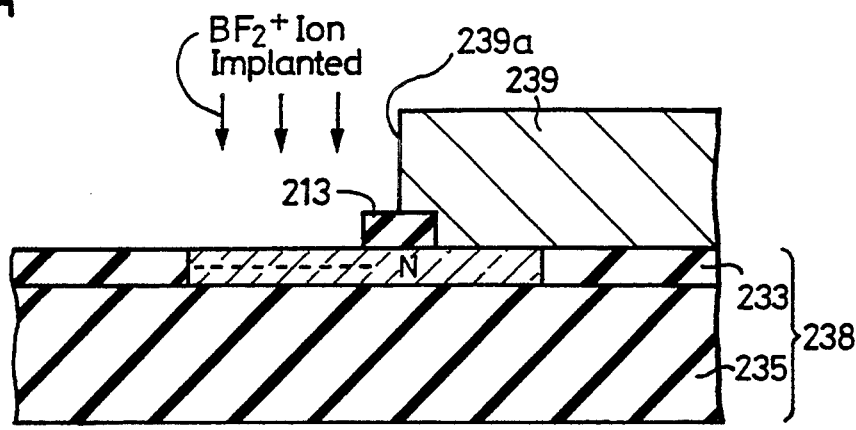

As shown in FIG. 23A, after the photoresist layer 239 was formed on the whole surface, an opening portion 239a is formed on the portion corresponding to one side of the element forming region 212. Then, impurity for forming a P-type base region, e.g., $BF_2^+$ ion is implanted under the state that the photoresist layer 239 and the insulating layer 213 are employed as the masks. As the conditions for this ion implantation, there are selected the implantation energy=60 keV and the implanted amount=$7 \times 10^{13} cm^{-2}$.

Figure 23B:
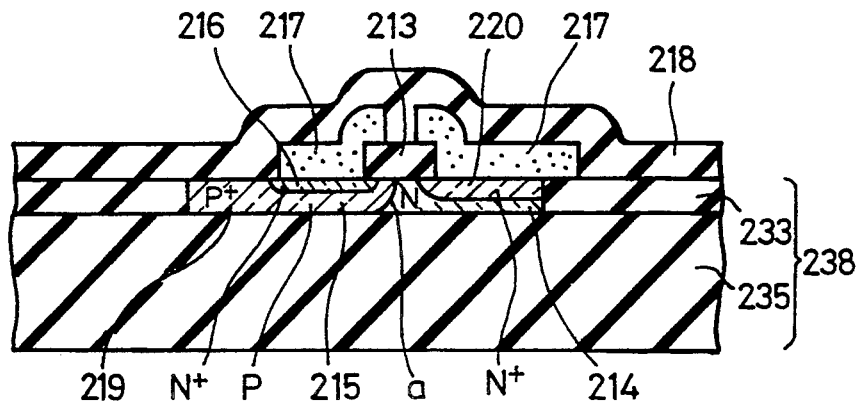

Then, as shown in FIG. 23B, after the photoresist layer 239 was removed, the polycrystalline silicon layer 217 having a thickness of about 50 nm in which N-type impurity, e.g., Arsenic (As) was doped on the whole surface is formed by the CVD method. Thereafter, by the patterning treatment based on the RIE process, the polycrystalline silicon layer 217 is left on the portions corresponding to the portions which become the emitter region 216 and the collector region 214. At that time, each of the polycrystalline silicon layer 217 is partly overlapped on the upper surface of the insulating layer 213.

Then, after the interlayer insulator 218 made of SiO$_2$ was formed on the whole surface, the product is treated by the heat treatment in the atmosphere of nitrogen (N$_2$) at temperature of 950° C. for 15 minutes. By this heat treatment, the P-type impurity implanted is diffused to form the P-type base region 215 and the base deriving region 219. Also, the N-type impurity from the polycrystalline silicon layer 217 is diffused to form the N-type emitter region 216 within the base region 215. Further, an N-type collector deriving region 220 is formed on the other side of the element forming region 212. At that time, the bonding surface a between the base region 215 and the collector region 214 exists under the insulating layer 213 and the collator-base withstand voltage is determined by the width of the insulating layer 213.

Figure 23C:
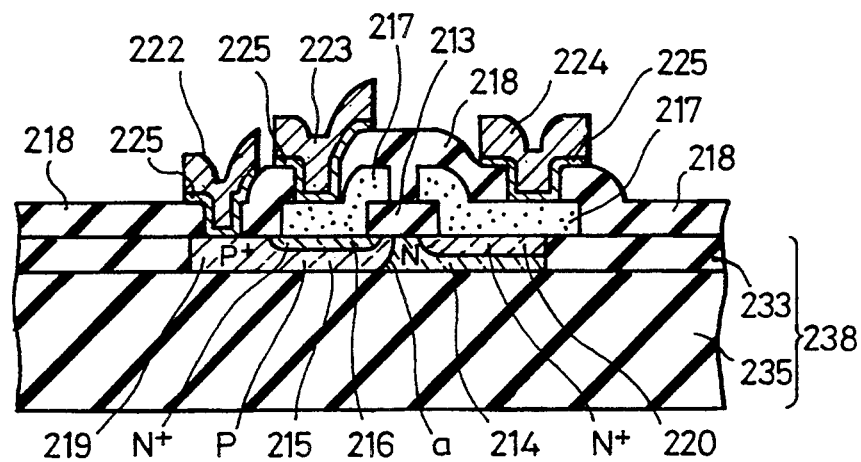

Then, as shown in FIG. 23C, opening portions are formed on the interlayer insulator 218 at its portions corresponding to the base deriving region 219 and the polycrystalline silicon layer 217 by the RIE process. Thereafter, a barrier metal 225 made of TiN/Ti and the Al layer are formed by the sputtering process. Then, the barrier metal 225 and the Al layer are treated by the patterning process to thereby form the base electrode 222, the emitter electrode 223 and the collector electrode 224 by the Al layer. Thus, the transistor according to the fourth embodiment of the present invention is obtained.

According to the fourth manufacturing method of the present invention, since the base region forming impurity is introduced into the element forming region 212 under the state that the insulating layer 213 is employed as the mask. Then the polycrystalline silicon layer 217 serving as the emitter diffusion source is formed so as to partly include the upper surface of the insulating layer 213, the respective impurities are doubly diffused through the same side wall of the insulating layer 213, whereby the P-type base region 215 and the N-type emitter region 216 are formed.

Accordingly, by controlling the double diffusion of impurities by the time, for example, the narrow base width Wb can be formed with satisfactory reproducibility and the emitter region 216 can be surrounded by the base region 215, which leads to the reduction of the base width Wb and the reduction of the base resistance Rb. Therefore, the transistor of this embodiment can be operated at high speed over the whole current region.

A method that can realize a transistor according to a fifth embodiment of the present invention will be described with reference to FIGS. 24 and 25. In this manufacturing method, the processes in which the SOI substrate 268 is manufactured are similar to those of the first manufacturing method and the manufacturing processes need not be described. Therefore, the processes following the process in which the SOI substrate 268 was manufactured will be described sequentially.

Figure 24A:
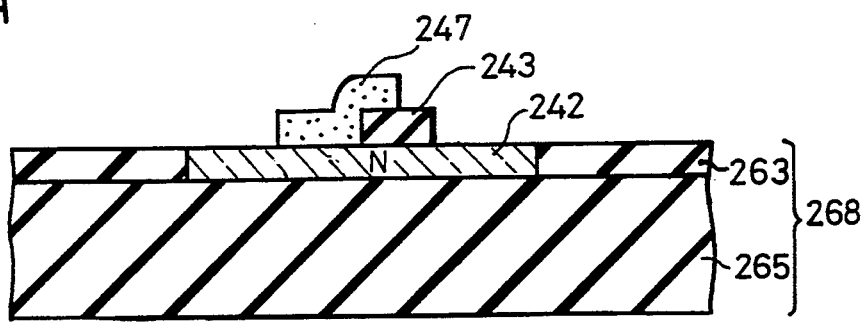

Initially, as shown in FIG. 24A, after an insulating layer 243 made of SiO$_2$ was formed on the whole surface by the CVD method, the product is treated by the patterning process such as the RIE process or the like, thereby leaving the pattern (insulating layer) 243 of rectangular configuration on the central portion of the element forming region 242. Thereafter, a polycrystalline silicon layer 247 having a thickness of about 150 nm is formed on the whole surface by the CVD method. Then, a polycrystalline silicon layer 247 is left at the portion corresponding to the portion which becomes an emitter region 246 by the patterning process based on the RIE process. At that time, the polycrystalline silicon layer 247 is partly overlapped on the upper surface of the insulating layer 243.

Figure 24B:
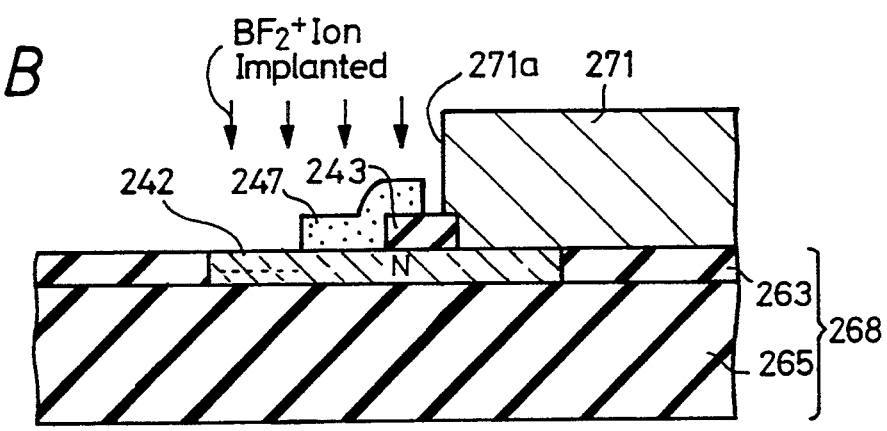

Then, as shown in FIG. 24B, after a photoresist layer 271 was formed on the whole surface, an opening portion 271a is formed at the portion corresponding to one side of the element forming region 242. In particular, the opening portion 271a is formed such that the polycrystalline silicon layer 247 is exposed through the opening portion 271a. Thereafter, impurity for forming P-type base region, e.g., BF$_2$+ion is implanted under the state that the photoresist layer 271 and the insulating layer 243 are employed as the masks.

By this ion implantation, P-type impurity is more deeply introduced into the element forming region 242 at its portion where the polycrystalline silicon layer 247 is not formed, i.e., the portion which becomes the base deriving area 249. In this case, P-type impurity is of course introduced into the polycrystalline silicon layer 247. The conditions of this ion implantation are such that an implantation energy=50 keV and that an implanted amount=$2\times10^{14}$cm$^{-2}$.

Figure 24C:
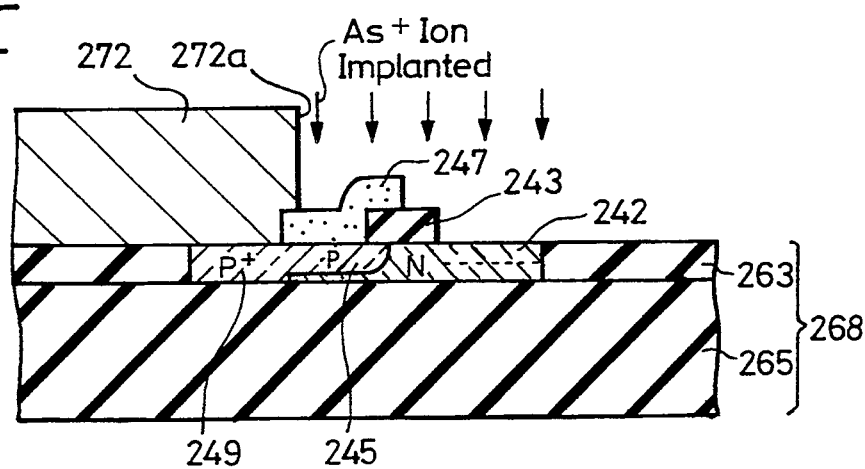

Then, as shown in FIG. 24C, the product was treated by the heat treatment at a temperature of 800° C. for 30 minutes in the atmosphere of nitrogen (N$_2$), whereafter the product is treated by the heat treatment at a temperature of 900° C. for 20 minutes in the atmosphere of nitrogen (N$_2$). By this continuous heat treatment, P-type impurities thus implanted are diffused to form the P-type base deriving area 249 and the P-type impurities are diffused from the polycrystalline silicon layer 247 to form a relatively shallow P-type base region 245.

Then, a photoresist layer 272 was formed on the whole surface, an opening 272a is formed on the portion corresponding to the other side of the element forming region 242. Also in this case, the opening portion 272a is formed such that the polycrystalline silicon layer 247 is exposed through the opening portion 272a. Thereafter, impurity for forming N-type emitter and collector regions, e.g., As+ is implanted under the state that the photoresist layer 272, the insulating layer 243 and the polycrystalline silicon layer 247 are employed as the masks.

By this ion implantation, N-type impurities are more deeply introduced into the element forming region 242 at its portion where the polycrystalline silicon layer 247 is not formed, i.e., the portion which becomes the collector deriving area 250. In this case, it is needless to say that the N-type impurities are introduced into the polycrystalline silicon layer 247. The conditions of this ion implantation are such that an implantation energy =40 keV and that an implanted amount=$1.5\times10^{16}$cm$^{-2}$.

Figure 25A:
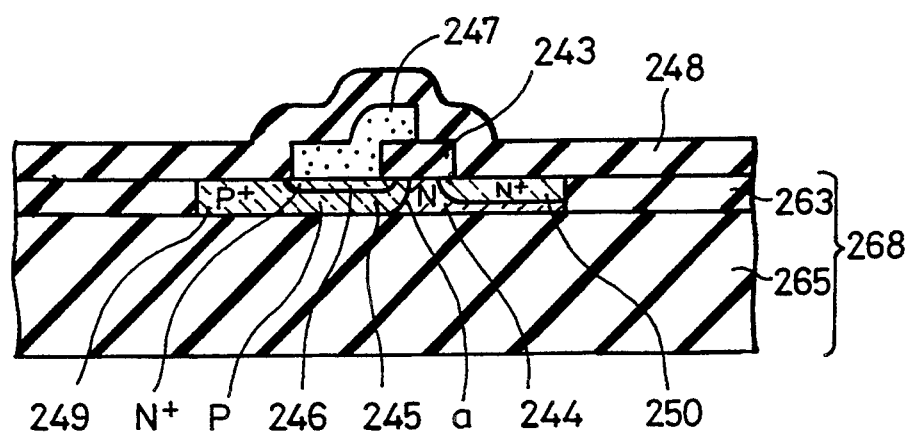

Then, as shown in FIG. 25A, an interlayer insulator 248 made of SiO$_2$ having a thickness of about 300 nm is formed on the whole surface by the CVD method. Then, after the product was treated by the heat treatment at a temperature of 800° C. for 30 minutes in the atmosphere of nitrogen (N$_2$), whereafter the product was treated by the heat treatment at a temperature of 1050° C. for 10 seconds in the atmosphere of nitrogen (N$_2$). By this continuous heat treatment, N-type impurities thus implanted are diffused to form an N-type collector deriving area 250, and N-type impurities are diffused from the polycrystalline silicon layer 247 to thereby form the N-type emitter region 246 within the base region 245. At that time, the bonded surface a between the base region 245 and the collector region 244 exists under the insulating layer 243 and the collector-base withstand voltage is determined by the width of the insulating layer 243.

Figure 25B:
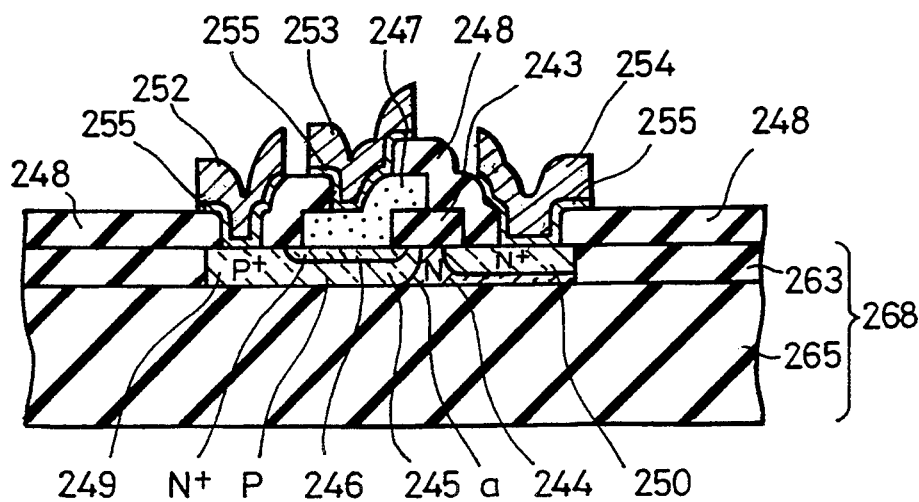

Then, as shown in FIG. 25B, after opening portions were formed through the interlayer insulator 248 at its portions corresponding to the base deriving region 249, the polycrystalline silicon layer 247 and the collector deriving region 250 by the RIE process, for example, a barrier metal 255 made of TiN/Ti and an Al layer are formed by the sputtering process. Thereafter, the barrier metal 255 and the Al layer are treated by the patterning process to thereby form a base electrode 252, an emitter electrode 253 and a collector electrode 254, each made of an Al layer. Thus, a transistor according to the fifth embodiment of the present invention can be obtained.

According to this manufacturing method, since the impurities for forming the emitter region are introduced into the polycrystalline silicon layer 247 after the impurities for forming the base region were introduced into the polycrystalline silicon layer 247 that was formed so as to partly include the upper surface of the insulating layer 243, respective impurities are sequentially diffused through the same side wall of the insulating layer 243, thereby forming the base region 245 and the emitter region 246.

Therefore, by controlling the diffusion of the impurities by time, the narrow base width Wb can be formed with satisfactory reproducibility and the emitter region 246 can be surrounded by the base region 245, which leads to the reduction of the base width Wb and the reduction of the base resistance Rb. Thus, the transistor of this embodiment can be operated at high speed on the whole current region. Particularly in the case of this manufacturing method, the shallow emitter region 246 can be formed as compared with the manufacturing method of the fourth embodiment of the present invention.

A manufacturing method that can realize the transistor according to the fifth embodiment of the present invention will be described with reference to FIG. 26. In this manufacturing method, the manufacturing method for one substrate 271 which is to be bonded is the same as that of the fourth embodiment and need not be described. Therefore, a manufacturing method of another substrate 276 to be bonded will be described sequentially.

Figure 26A:
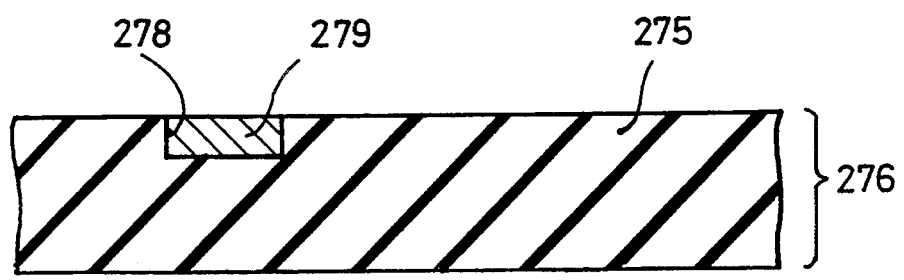

Initially, as shown in FIG. 26A, after the thermal oxide layer 275 was formed on the surface of the other substrate 276, a concave portion 278 is formed on the layer 275 at its portion corresponding to a portion which becomes a base region By the etching process such as the RIE process or the like. Thereafter, a conductive layer 279 such as a tungsten silicide layer in which P-type impurity, e.g., Boron (B) is doped or polycrystalline silicon layer or the like is formed on the whole surface. Then, the whole surface is treated by the etch-back process based on the RIE process, whereby the conductive layer 279 is buried into the concave portion 278.

Figure 26B:
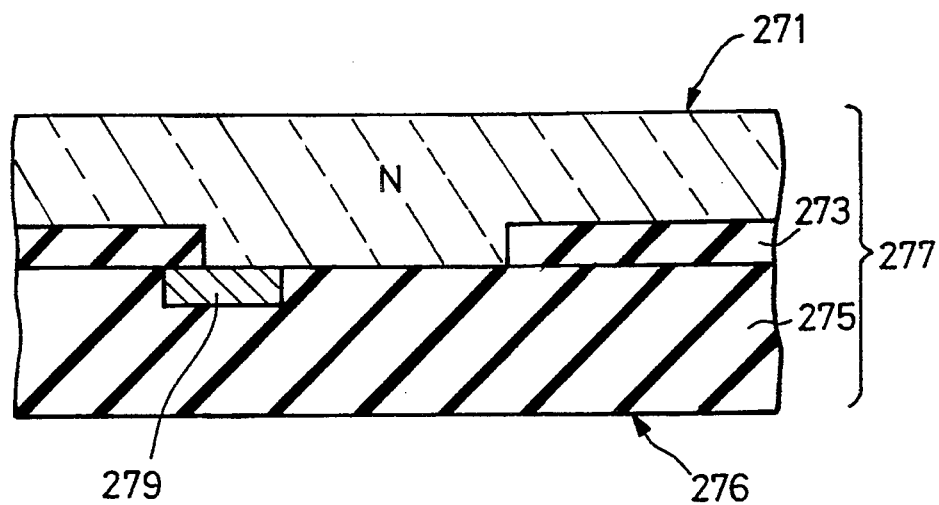

Then, as shown in FIG. 26B, the substrates 271 and 276 are bonded while the surface in which the portion serving as the element forming region is exposed and the surface of the thermal oxide layer 275 are being opposed, thereby manufacturing a bonded substrate 277.

The succeeding processes may be effected by using the manufacturing method of the above fourth embodiment.

According to the semiconductor apparatus of the present invention, the base width can be reduced, the base resistance can be reduced and the operation speed on the whole current region can be improved.

Furthermore, according to the manufacturing method of the semiconductor apparatus of the present invention, it is possible to manufacture with ease the semiconductor apparatus in which the base width can be reduced, the base resistance can be reduced and the operation speed on the whole current region can be improved.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method for manufacturing a semiconductor apparatus which has second conductivity type emitter region and collector region and a first conductivity type base region arranged in a lateral direction within a first conductivity type element forming region which is surrounded from its side portions and its lower portion by an insulating layer, comprising the steps of:

providing the element forming region;

forming an interlayer on said element forming region;

forming an opening portion on said interlayer at a portion corresponding to a portion which will become said emitter region;

selectively forming a semiconductor layer on said opening portion so that a part of said semiconductor layer is overgrown over said interlayer in the lateral direction; and introducing a second conductivity type impurity into one side of said element forming region and said semiconductor layer while preventing introduction in the other side of said element forming region;

introducing a first conductivity type impurity in said other side of the element forming region; and heat treating to diffuse the second conductivity type impurities to form the collector and emitter.

2. A method according to claim 1, which includes providing the element forming region by providing a first substrate of the first conductive type having a step to form an element forming region, forming an $SiO_2$ layer surrounding said element forming region, bonding another substrate with an $SiO_2$ layer onto the element forming region and then polishing away the first substrate to expose the element forming region.

3. A method according to claim 1 wherein the step of providing the element forming region provides the region in two sub-regions interconnected by an underlying conductive layer.

4. A method for manufacturing a semiconductor apparatus which has a first conductivity type emitter region and collector region and a second conductivity type base region arranged in the lateral direction within a first conductivity type element forming region which is surrounded on its side portions and its lower portion by an insulating layer, comprising the steps of:

providing the element forming region;

forming an island-shaped insulating layer on said element forming region;

selectively introducing an impurity for forming a second conductivity type base region into one side of said element forming region under the state that said island-shaped insulating layer is employed as a mask; and forming a semiconductor layer serving as an emitter diffusion layer on a part of said element forming region in which said impurity is introduced so that said semiconductor layer includes a pair of an upper surface of said island-shaped insulating layer.

5. A method according to claim 4, which includes providing the element forming region by providing a first substrate of a first conductive type having steps to form an element forming region, forming an $SiO_2$ layer surrounding said element forming region, bonding another substrate with an $SiO_2$ layer onto the element forming region and then polishing away the first substrate to expose the element forming region.

6. A method according to claim 4, wherein a conductive layer for a base electrode is formed in advance on an under layer of one side of said element forming region.

7. A method for manufacturing a semiconductor apparatus which has a first conductivity type emitter region and collector region and a second conductivity type base region arranged in a lateral direction within a first conductivity type element forming region which is surrounded on its side portions and its lower portion by an insulating layer, comprising the steps of:

providing the element forming region;

forming an island-shaped insulating layer on said element forming region;

forming a semiconductor layer on a part of one side of said element forming region so that said semiconductor layer includes a part of an upper surface of said island-shaped insulating layer;

introducing an impurity for forming a second conductivity type base region into said exposed semiconductor layer under the state that the other side of said element forming region is masked; and introducing an impurity for forming a first conductivity type emitter region into said exposed semiconductor layer under the state that the other side of said element forming region is masked.

8. The method for manufacturing a semiconductor apparatus according to claim 7, wherein a conductive layer for a base electrode is formed in advance on an under layer of one side of said element forming region.

9. A method according to claim 7, which includes providing the element forming region by providing a first substrate of the first conductive type having a step to form an element forming region, forming an $SiO_2$ layer surrounding said element forming region, bonding a second substrate with an $SiO_2$ layer onto the element forming region and subsequently polishing away the first substrate to expose the element forming region.

* * * * *